US012666694B2

(12) United States Patent
Kim et al.

(10) Patent No.: US 12,666,694 B2
(45) Date of Patent: Jun. 23, 2026

(54) SEMICONDUCTOR DEVICE INCLUDING ISOLATION PATTERN FORMED BASED ON INSULATING LAYER AND METHOD FOR MANUFACTURING THE SAME

(71) Applicant: SAMSUNG ELECTRONICS CO., LTD., Suwon-si (KR)

(72) Inventors: Heesub Kim, Suwon-si (KR); Gunho Jo, Suwon-si (KR); Bomi Kim, Suwon-si (KR); Eunho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 301 days.

(21) Appl. No.: 18/215,459

(22) Filed: Jun. 28, 2023

(65) Prior Publication Data

US 2024/0194536 A1 Jun. 13, 2024

(30) Foreign Application Priority Data

Dec. 8, 2022 (KR) ........................ 10-2022-0170805

(51) Int. Cl.
*H10D 84/03* (2025.01)
*B82Y 10/00* (2011.01)
(Continued)

(52) U.S. Cl.
CPC ....... *H10D 84/038* (2025.01); *H10D 84/0151* (2025.01); *H10D 84/83* (2025.01)

(58) Field of Classification Search
CPC ............. H10D 64/017; H10D 30/6735; H10D 84/0151; H10D 62/115; H10D 62/116;
(Continued)

(56) References Cited

U.S. PATENT DOCUMENTS

| | | | |
|---|---|---|---|
| 7,514,325 B2 | 4/2009 | Kim et al. | |
| 8,436,404 B2 | 5/2013 | Bohr et al. | |

(Continued)

FOREIGN PATENT DOCUMENTS

| | | |
|---|---|---|
| CN | 114078762 A | 2/2022 |
| KR | 10-0707208 B1 | 4/2007 |

(Continued)

*Primary Examiner* — Sonya McCall-Shepard

(74) *Attorney, Agent, or Firm* — Sughrue Mion, PLLC

(57) ABSTRACT

A method for manufacturing a semiconductor device includes: forming a semiconductor structure and a dummy structure on a substrate; forming a first insulating layer between the semiconductor structure and the dummy structure; forming a first space by removing the dummy structure; forming an isolation pattern in the first space; forming a main gate sacrificial pattern crossing the first direction to overlap the semiconductor structure; forming second spaces by removing portions of the semiconductor structure at both sides of the main gate sacrificial pattern, and forming source/drain patterns in the second spaces; forming a second insulating layer on the source/drain patterns; forming a third space by removing the main gate sacrificial pattern, and forming a gate electrode in the third space; and forming fourth spaces by removing the second insulating layer, and forming, in the fourth spaces, contact structures connected to the source/drain patterns and disposed on both sides of the isolation pattern.

14 Claims, 43 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 62/822* | (2025.01) |
| *H10D 64/01* | (2025.01) |
| *H10D 84/01* | (2026.01) |
| *H10D 84/83* | (2025.01) |

(58) Field of Classification Search
CPC ............ H10D 30/0243; H10D 64/256; H10D 84/0149; H10D 84/0188; H10D 30/014; H10D 30/43; H10D 30/6757; H10D 84/0186; H10D 30/6219

See application file for complete search history.

(56) References Cited

U.S. PATENT DOCUMENTS

| | | | | |
|---|---|---|---|---|
| 8,697,515 | B2 * | 4/2014 | Yin | .................... H10D 30/0243 |
| | | | | 257/E21.409 |
| 9,054,178 | B2 | 6/2015 | Bohr et al. | |
| 9,093,513 | B2 | 7/2015 | Bohr et al. | |
| 9,466,565 | B2 | 10/2016 | Bohr et al. | |
| 9,508,821 | B2 | 11/2016 | Bohr et al. | |
| 9,892,967 | B2 | 2/2018 | Bohr et al. | |
| 10,141,226 | B2 | 11/2018 | Bohr et al. | |
| 10,319,581 | B1 | 6/2019 | Wen et al. | |
| 10,629,483 | B2 | 4/2020 | Bohr et al. | |
| 10,804,398 | B2 | 10/2020 | Frougier et al. | |
| 10,872,781 | B2 | 12/2020 | Lee et al. | |
| 10,930,557 | B2 | 2/2021 | Bohr et al. | |
| 11,024,536 | B2 | 6/2021 | Carr et al. | |
| 11,094,794 | B2 | 8/2021 | Frougier et al. | |
| 2007/0145431 | A1 | 6/2007 | Kim et al. | |
| 2011/0156107 | A1 | 6/2011 | Bohr et al. | |
| 2013/0178033 | A1 | 7/2013 | Bohr et al. | |
| 2014/0151817 | A1 | 6/2014 | Bohr et al. | |
| 2015/0270216 | A1 | 9/2015 | Bohr et al. | |
| 2016/0155815 | A1 | 6/2016 | Bohr et al. | |
| 2017/0040218 | A1 | 2/2017 | Bohr et al. | |
| 2018/0096891 | A1 | 4/2018 | Bohr et al. | |
| 2019/0051558 | A1 | 2/2019 | Bohr et al. | |
| 2019/0363085 | A1 | 11/2019 | Oh et al. | |
| 2020/0119180 | A1 | 4/2020 | Frougier et al. | |
| 2020/0152751 | A1 | 5/2020 | Greene et al. | |
| 2020/0251387 | A1 | 8/2020 | Bohr et al. | |
| 2021/0036121 | A1 | 2/2021 | Lim et al. | |
| 2021/0134673 | A1 | 5/2021 | Bohr et al. | |
| 2023/0299165 | A1 * | 9/2023 | Guler | ................. H10D 30/6735 |
| 2023/0317566 | A1 * | 10/2023 | Fan | ...................... H10D 62/364 |
| 2023/0369468 | A1 * | 11/2023 | Chen | ...................... H10D 84/83 |
| 2025/0169173 | A1 | 5/2025 | Oh et al. | |

FOREIGN PATENT DOCUMENTS

| | | | |
|---|---|---|---|
| KR | 10-1459198 | B1 | 11/2014 |
| KR | 10-2019-0134283 | A | 12/2019 |

* cited by examiner

SEMICONDUCTOR DEVICE INCLUDING ISOLATION PATTERN FORMED BASED ON INSULATING LAYER AND METHOD FOR MANUFACTURING THE SAME

CROSS-REFERENCE TO RELATED APPLICATION

This application is based on and claims priority to and the benefit of Korean Patent Application No. 10-2022-0170805 filed in the Korean Intellectual Property Office on Dec. 8, 2022, the disclosure of which is incorporated herein in its entirety by reference.

BACKGROUND

1. Field

The example embodiments of the disclosure relate to a semiconductor device and a method for manufacturing the same.

2. Description of the Related Art

A semiconductor, which is a material belonging to an intermediate region between a conductor and a nonconductor, refers to a material that conducts electricity under predetermined conditions. Various semiconductor devices, e.g., memory devices, may be manufactured using such a semiconductor material. These semiconductor devices may be used in various electronic devices.

In accordance with the trend of electronic devices toward miniaturization and high integration density, it is necessary to finely form patterns constituting the semiconductor devices. A defect such as a short circuit may occur between adjacent source/drain region patterns or adjacent source/drain contact structures made of such fine patterns.

SUMMARY

The example embodiments of the disclosure provide a semiconductor device and a method for manufacturing the same having advantages of stably forming fine patterns and improved isolation between adjacent source/drain patterns and adjacent source/drain contact structures.

According to embodiments, there is provided a method for manufacturing a semiconductor device which may include: forming a semiconductor structure and a dummy structure extending in a first direction on a substrate; forming a first insulating layer between the semiconductor structure and the dummy structure; forming a first space by removing the dummy structure; forming an isolation pattern in the first space; forming a main gate sacrificial pattern extending in a second direction crossing the first direction to overlap the semiconductor structure; forming second spaces by removing portions of the semiconductor structure at both sides of the main gate sacrificial pattern, and forming source/drain patterns in the second spaces; forming a second insulating layer on the source/drain patterns; forming a third space by removing the main gate sacrificial pattern, and forming a gate electrode in the third space; and forming fourth spaces by removing the second insulating layer, and forming, in the fourth spaces, contact structures connected to the source/drain patterns and disposed on both sides of the isolation pattern.

According to an embodiment, there is provided a semiconductor device which may include: a substrate; active patterns on the substrate; source/drain patterns on the active patterns; a channel pattern on each of the active patterns and between the source/drain patterns; a gate electrode surrounding the channel pattern; contact structures on the source/drain patterns; a dummy pattern between the active patterns; and an isolation pattern between the contact structures and on the dummy pattern.

According to an embodiment, there is provided a semiconductor device which may include: a substrate; a channel pattern on the substrate; a gate electrode surrounding the channel pattern; source/drain patterns on both sides of the channel pattern; an isolation pattern between the source/drain patterns; contact structures connected to the source/drain patterns; and spacers between the isolation pattern and the contact structures.

BRIEF DESCRIPTION OF DRAWINGS

FIGS. 1B, 2B, 3B, 4B, 5B, 6B, 7B, 8B, 9B, 10B, 11B, and 12B are cross-sectional views taken along lines Y1-Y1' of the respective plan views.

Figure 10C:
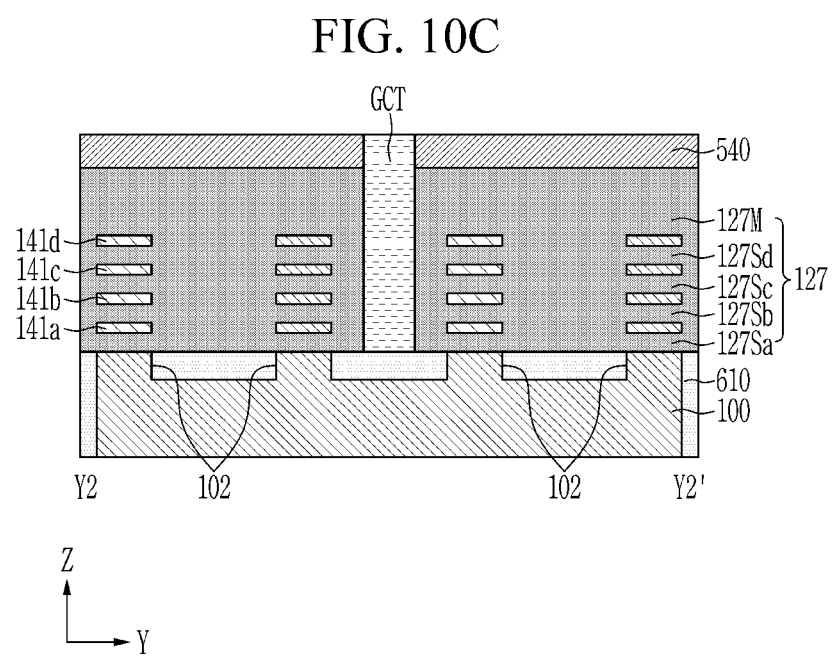

FIGS. 7C, 8C, 9C, 10C, and 12C are cross-sectional views taken along lines Y2-Y2' of the respective plan views.

DETAILED DESCRIPTION

Figure 1A:
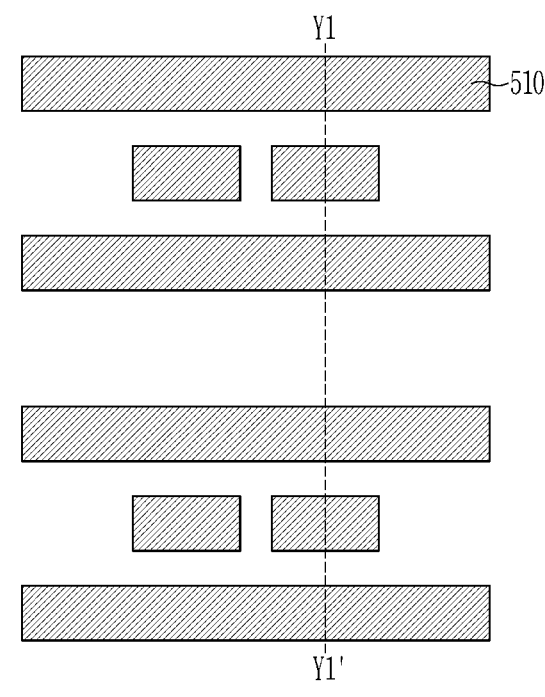
FIGS. 1A, 2A, 3A, 4A, 5A, 6A, 7A, 8A, 9A, 10A, 11A, and 12A are plan views sequentially illustrating a method for manufacturing a semiconductor device, according to embodiments.
Figure 1A:
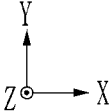

Hereinafter, embodiments of the disclosure will be described in detail with reference to the accompanying drawings so that they can be easily carried out by those of ordinary skill in the art to which the disclosure pertains. The embodiments described herein are example embodiments, and thus, the disclosure is not limited thereto and may be realized in various other forms.

In order to clearly explain the disclosure, parts irrelevant to the embodiments may be omitted, and the same or similar components may be denoted by the same reference signs throughout the specification.

In addition, the size and thickness of each component illustrated in the drawings are arbitrary for convenience of description, and the disclosure is not necessarily limited to what is illustrated in the drawings. In order to clearly express several parts and regions, their thicknesses are enlarged. In addition, for convenience of explanation, thicknesses of some layers and regions are exaggerated in the drawings.

In addition, when a part such as a layer, a film, a region, or a plate is referred to as being "on" another part, it may be "directly on" the another part or there may be an intervening part therebetween. In contrast, when a part is referred to as being "directly on" another part, there is no intervening part therebetween. In addition, when a part is referred to as being "on" a reference part, it is disposed on or below the reference part, and does not necessarily mean that it is disposed "on" the reference part in the opposite direction of gravity.

In addition, when a certain part is referred to as "comprising" or "including" a certain component throughout the specification, this implies the presence of any other components, not precluding the presence of any other components, unless explicitly stated to the contrary. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

In addition, throughout the specification, the phrase "in a plan view" means when a target part is viewed from above, the phrase "in a cross-sectional view" means when a cross section of a target part as vertically cut is viewed laterally.

Hereinafter, a method for manufacturing a semiconductor device according to an embodiment will be described with reference to FIGS. 1A to 12D.

Figure 10A:
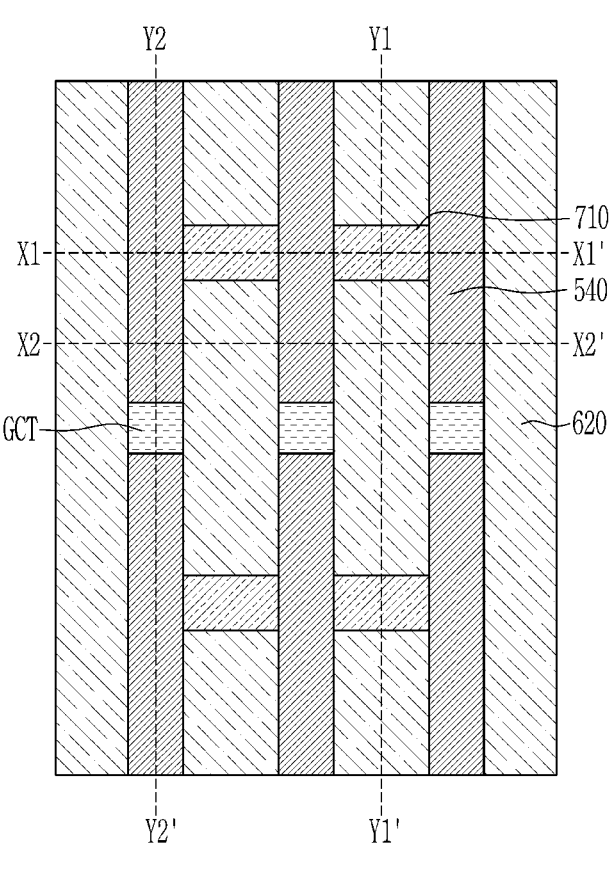
Figure 10A:
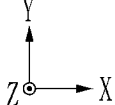
Figure 10B:
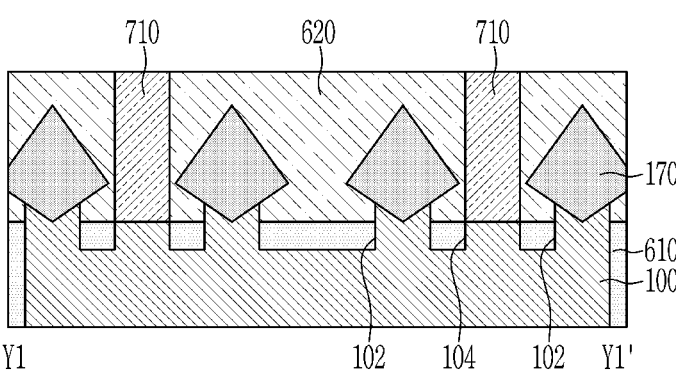
Figure 10B:
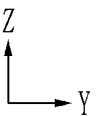
Figure 10D:
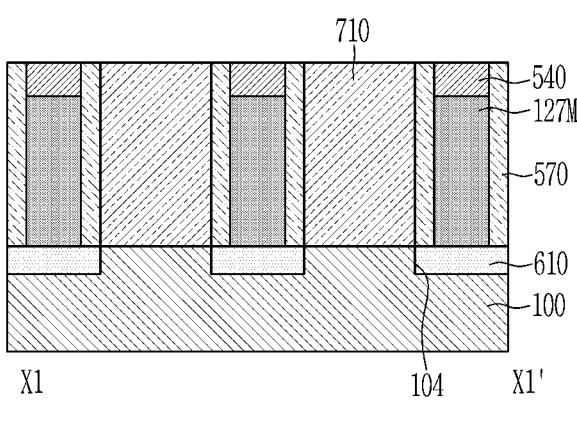
Figure 10E:
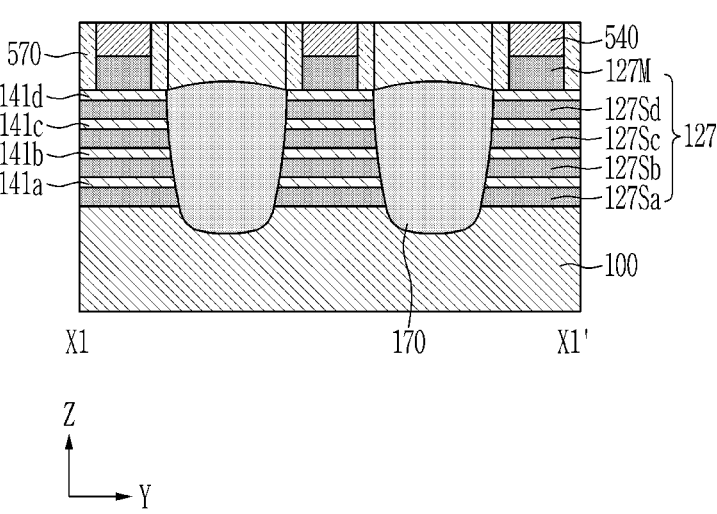
Figure 11A:
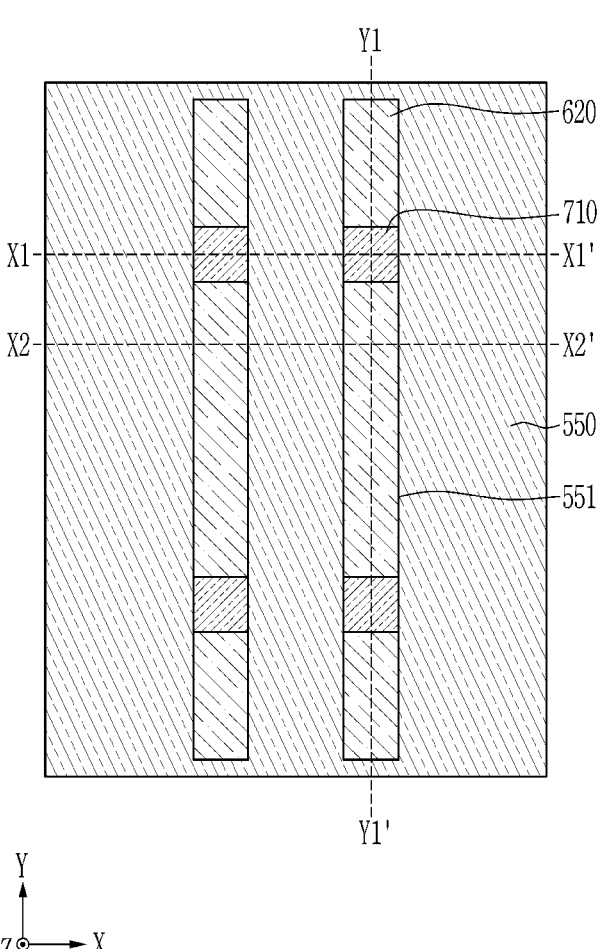
Figure 11B:
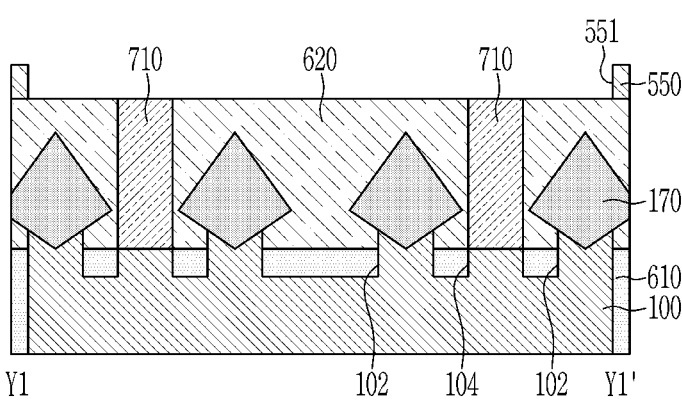
Figure 11B:
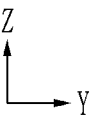
Figure 11C:
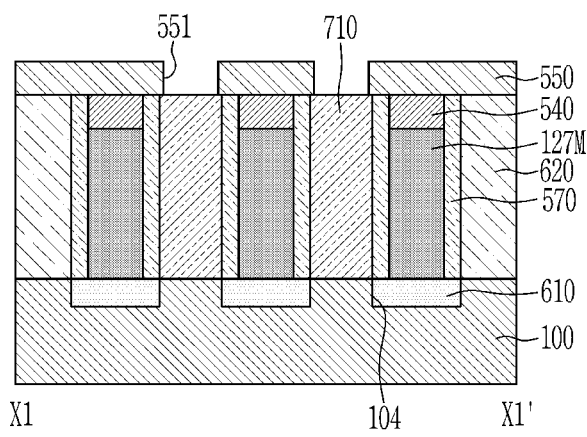
Figure 11C:
Figure 11D:
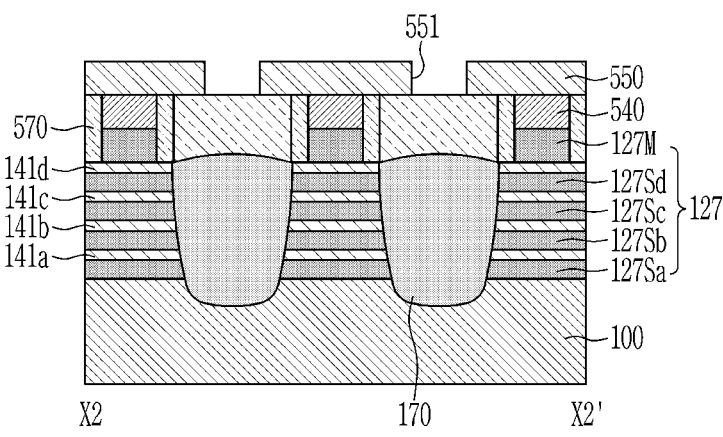
Figure 11D:
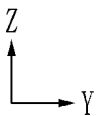
Figure 12A:
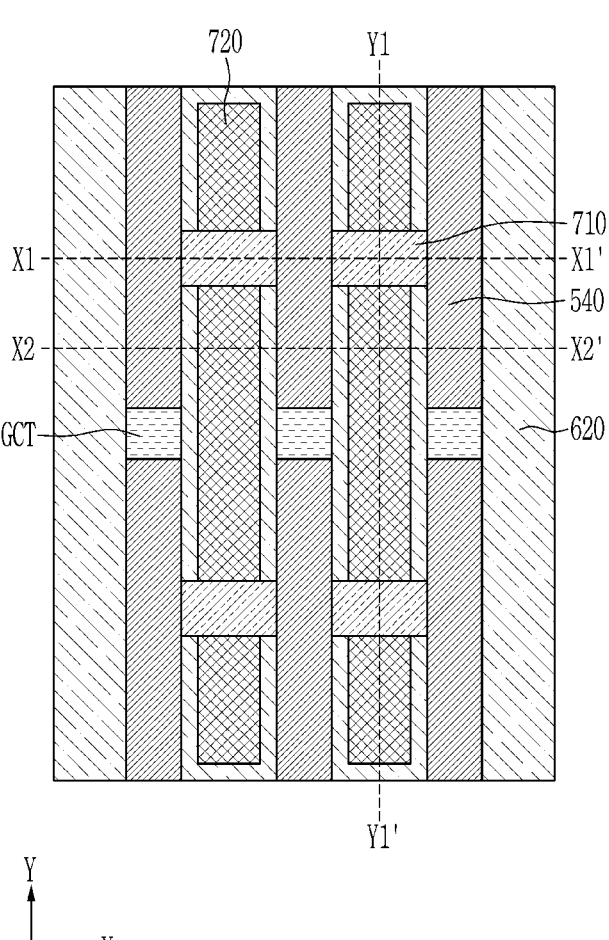
Figure 12B:
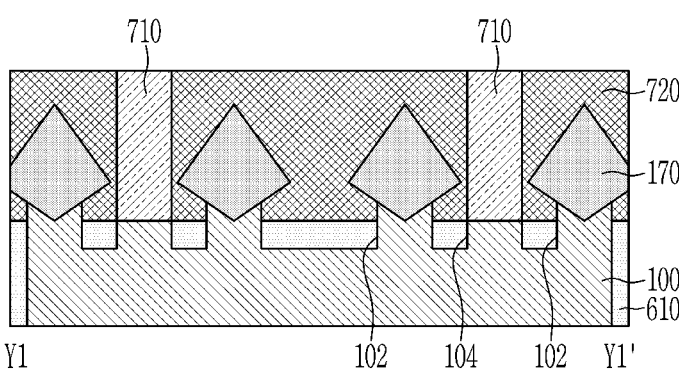
Figure 12B:
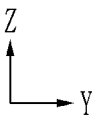
Figure 12C:
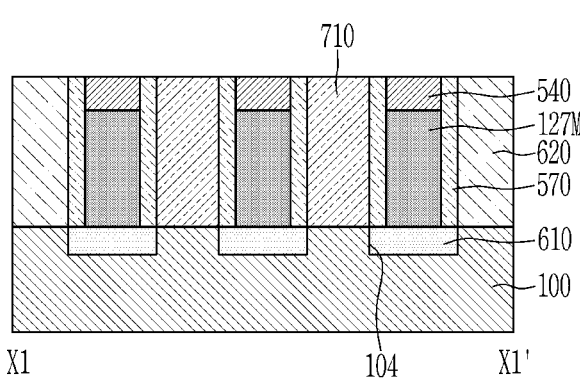
Figure 12C:
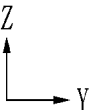
Figure 12D:
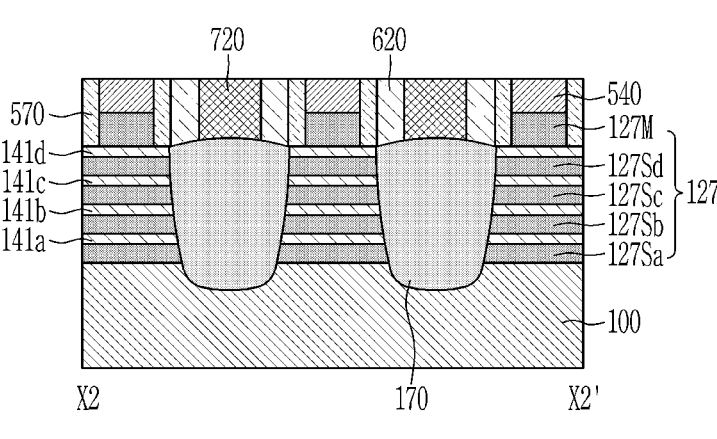

FIGS. 1A to 12D are views sequentially illustrating a method for manufacturing a semiconductor device according to an embodiment. FIGS. 1A, 2A, 3A, 4A, 5A, 6A, 7A, 8A, 9A, 10A, 11A, and 12A are plan views sequentially illustrating the method for manufacturing a semiconductor device according to an embodiment. FIGS. 1B, 2B, 3B, 4B, 5B, 6B, 7B, 8B, 9B, 10B, 11B, and 12B are cross-sectional views taken along lines Y1-Y1' of the respective plan views. FIGS. 7C, 8C, 9C, 10C, and 12C are cross-sectional views taken along lines Y2-Y2' of the respective plan views. FIGS. 7D, 10D, and 11C are cross-sectional views taken along lines X1-X1' of the respective plan views. FIGS. 7E, 8D, 9D, 10E, 11D, and 12D are cross-sectional views taken along lines X2-X2' of the respective plan views.

Figure 1B:
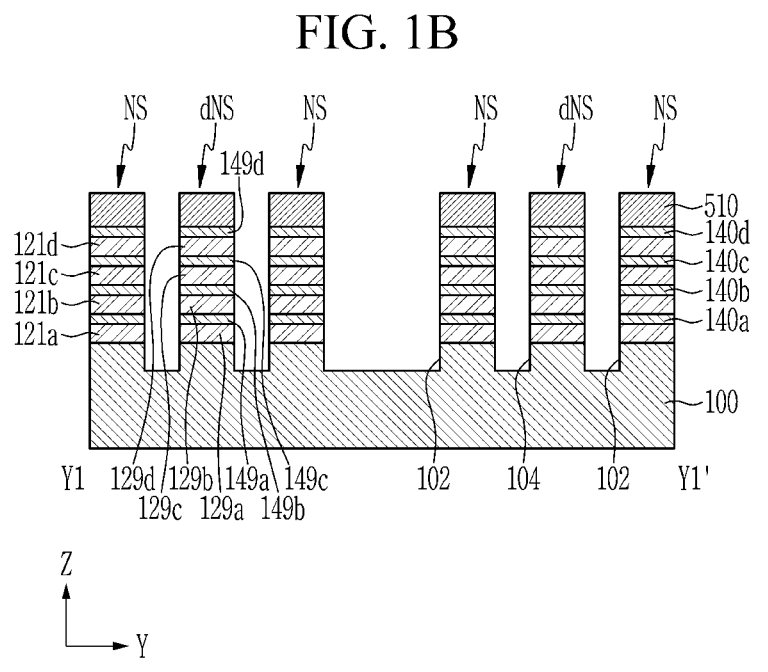

As illustrated in FIGS. 1A and 1B, a nanosheet structure NS and a dummy nanosheet structure dNS are formed on a substrate 100. The nanosheet structure NS includes a plurality of sub-gate sacrificial patterns 121a, 121b, 121c, and 121d and a plurality of semiconductor patterns 140a, 140b, 140c, and 140d that are alternately stacked. The dummy nanosheet structure dNS includes a plurality of dummy gate sacrificial patterns 129a, 129b, 129c, and 129d and a plurality of dummy semiconductor patterns 149a, 149b, 149c, and 149d that are alternately stacked.

The substrate 100 may include a semiconductor material. For example, the substrate 100 may include a group IV semiconductor, a group III-V compound semiconductor, a group II-VI compound semiconductor, or the like. For example, the substrate 100 may include a semiconductor such as Si or Ge, or a compound semiconductor such as SiGe, SiC, GaAs, InAs, or InP. The substrate 100 may have an upper surface parallel to a first direction (x direction) and a second direction (y direction), and may have a thickness parallel to a third direction (z direction) perpendicular to the first direction (x direction) and the second direction (y direction). The first direction (x direction) may be referred to as a channel-length direction in which a current flows between source/drain patterns connected by a channel structure or pattern, and the second direction (y direction) may be referred to as a channel-width direction perpendicular to the channel-length direction.

An active pattern 102 and a dummy pattern 104 protruding from the upper surface of the substrate 100 may be formed on the substrate 100. The active pattern 102 and the dummy pattern 104 may protrude from the upper surface of the substrate 100 in the third direction (z direction). The active pattern 102 and the dummy pattern 104 may be spaced apart from each other in the second direction (y direction). The dummy pattern 104 may be formed between adjacent active patterns 102. The active pattern 102 and the dummy pattern 104 may elongate in the first direction (x direction). The active pattern 102 may have a different length in the first direction (x direction) from the dummy pattern 104. For example, the active pattern 102 may be longer in the first direction (x direction) than the dummy pattern 104. The active pattern 102 may have a different width in the second direction (y direction) from the dummy pattern 104. For example, the active pattern 102 may be wider in the second direction (y direction) than the dummy pattern 104. However, the relationships in length and width between the active pattern 102 and the dummy pattern 104 are not limited thereto.

The nanosheet structure NS may be formed on the active pattern 102, and the dummy nanosheet structure dNS may be formed on the dummy pattern 104. The nanosheet structure NS may contact the active pattern 102, and the dummy nanosheet structure dNS may contact the dummy pattern 104.

The plurality of sub-gate sacrificial patterns 121a, 121b, 121c, and 121d may include a first sub-gate sacrificial pattern 121a, a second sub-gate sacrificial pattern 121b, a third sub-gate sacrificial pattern 121c, and a fourth sub-gate sacrificial pattern 121d. The plurality of semiconductor patterns 140a, 140b, 140c, and 140d may include a first semiconductor pattern 140a, a second semiconductor pattern 140b, a third semiconductor pattern 140c, and a fourth semiconductor pattern 140d. For example, the nanosheet structure NS may be formed by sequentially stacking, on the substrate 100, the first sub-gate sacrificial pattern 121a, the first semiconductor pattern 140a, the second sub-gate sacrificial pattern 121b, the second semiconductor pattern 140b, the third sub-gate sacrificial pattern 121c, the third semiconductor pattern 140c, the fourth sub-gate sacrificial pattern 121d, and the fourth semiconductor pattern 140d. The first sub-gate sacrificial pattern 121a may be formed on the active pattern 102, and may contact the active pattern 102. Although it has been described above that the four sub-gate sacrificial patterns 121a, 121b, 121c, and 121d and the four semiconductor patterns 140a, 140b, 140c, and 140d are alternately stacked, this is merely an example, and various modifications may be made. For example, the number of stacked sub-gate sacrificial patterns 121a, 121b, 121c, and 121d or the number of stacked semiconductor patterns 140a, 140b, 140c, and 140d may be more or less than four.

The plurality of dummy gate sacrificial patterns 129a, 129b, 129c, and 129d may include a first dummy gate sacrificial pattern 129a, a second dummy gate sacrificial pattern 129b, a third dummy gate sacrificial pattern 129c, and a fourth dummy gate sacrificial pattern 129d. The plurality of dummy semiconductor patterns 149a, 149b, 149c, and 149d may include a first dummy semiconductor pattern 149a, a second dummy semiconductor pattern 149b, a third dummy semiconductor pattern 149c, and a fourth dummy semiconductor pattern 149d. For example, the dummy nanosheet structure dNS may be formed by sequentially stacking, on the substrate 100, the first dummy gate sacrificial pattern 129a, the first dummy semiconductor pattern 149a, the second dummy gate sacrificial pattern 129b, the second dummy semiconductor pattern 149b, the third dummy gate sacrificial pattern 129c, the third dummy semiconductor pattern 149c, the fourth dummy gate sacrificial pattern 129d, and the fourth dummy semiconductor pattern 149*d*. The first dummy gate sacrificial pattern 129*a* may be formed on the dummy pattern 104, and may contact the dummy pattern 104. Although it has been described above that the four dummy gate sacrificial patterns 129*a*, 129*b*, 129*c*, and 129*d* and the four dummy semiconductor patterns 149*a*, 149*b*, 149*c*, and 149*d* are alternately stacked, this is merely an example, and various modifications may be made. For example, the number of stacked dummy gate sacrificial patterns 129*a*, 129*b*, 129*c*, and 129*d* or the number of stacked dummy semiconductor patterns 149*a*, 149*b*, 149*c*, and 149*d* may be more or less than four.

The nanosheet structure NS and the dummy nanosheet structure dNS may be formed using an epitaxial growth method. The plurality of sub-gate sacrificial patterns 121*a*, 121*b*, 121*c*, and 121*d* and the plurality of dummy gate sacrificial patterns 129*a*, 129*b*, 129*c*, and 129*d* may be made of the same material. The plurality of semiconductor patterns 140*a*, 140*b*, 140*c*, and 140*d* and the plurality of dummy semiconductor patterns 149*a*, 149*b*, 149*c*, and 149*d* may be made of the same material. For example, layers made of silicon germanium (SiGe) and layers made of silicon (Si) are alternately formed using the epitaxial growth method, and a hard mask pattern 510 is formed thereon. The hard mask pattern 510 may be made of silicon nitride (SiN). Using the hard mask pattern 510 as a mask, the layers made of silicon germanium and the layers made of silicon may be patterned to form a nanosheet structure NS and a dummy nanosheet structure dNS. Thus, the hard mask pattern 510 may be disposed on the nanosheet structure NS and the dummy nanosheet structure dNS. In this case, the plurality of sub-gate sacrificial patterns 121*a*, 121*b*, 121*c*, and 121*d* and the plurality of dummy gate sacrificial patterns 129*a*, 129*b*, 129*c*, and 129*d* may be formed of silicon germanium (SiGe). The plurality of semiconductor patterns 140*a*, 140*b*, 140*c*, and 140*d* and the plurality of dummy semiconductor patterns 149*a*, 149*b*, 149*c*, and 149*d* may be made of silicon (Si). However, the materials of the sub-gate sacrificial patterns 121*a*, 121*b*, 121*c*, and 121*d*, the dummy gate sacrificial patterns 129*a*, 129*b*, 129*c*, and 129*d*, the semiconductor patterns 140*a*, 140*b*, 140*c*, and 140*d*, and the dummy semiconductor patterns 149*a*, 149*b*, 149*c*, and 149*d* are not limited thereto, and may be variously modified.

In a plan view, the nanosheet structure NS may extend in the first direction (x direction). A plurality of nanosheet structures NS extending in the first direction (x direction) may be formed on the substrate 100, and the dummy nanosheet structure dNS may be formed between the nanosheet structures NS in the second direction (y direction). Each of a plurality of dummy nanosheet structures dNS may be formed between two adjacent ones of the nanosheet structures NS. The plurality of dummy nanosheet structures dNS may be formed to be spaced apart from each other in the first direction (x direction).

Figure 2A:
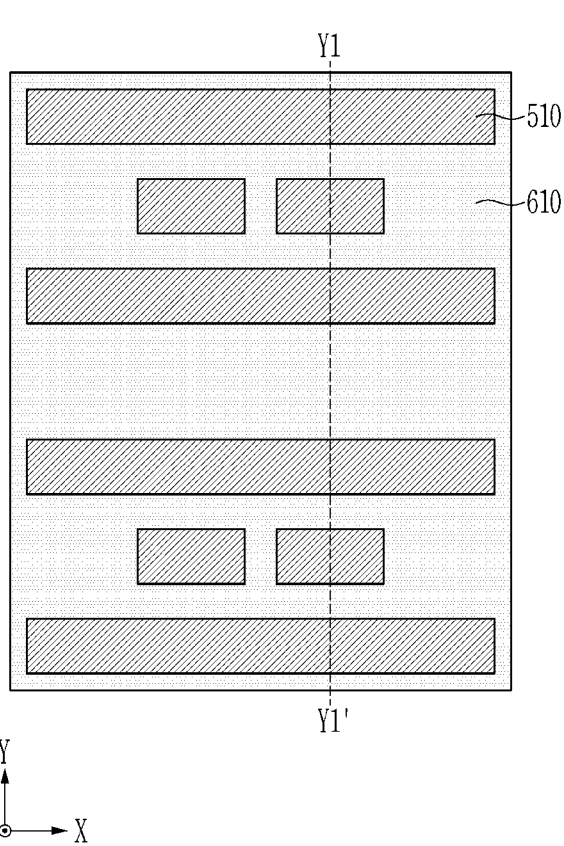
Figure 2B:
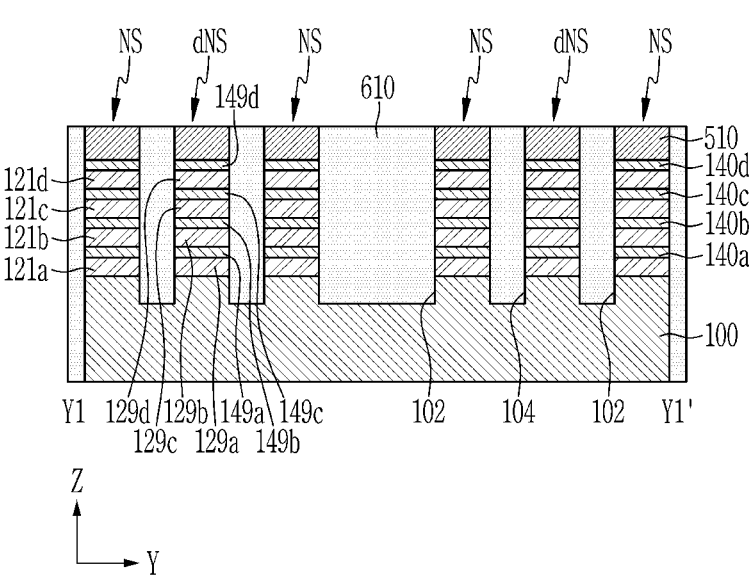

As illustrated in FIGS. 2A and 2B, an insulating layer 610 is formed between the plurality of nanosheet structures NS and the plurality of dummy nanosheet structures dNS.

The insulating layer 610 is formed on the substrate 100 on which the nanosheet structures NS and the dummy nanosheet structures dNS are formed. The insulating layer 610 may be made of an insulating material capable of filling an empty space well. For example, the insulating layer 610 may include silicon oxide, Tonen SilaZene (TOSZ), or the like. Next, a chemical mechanical polishing (CMP) process may be performed to planarize an upper surface of the insulating layer 610. Accordingly, an upper surface of the hard mask pattern 510 may be planarized together with the upper surface of the insulating layer 610.

Figure 3A:
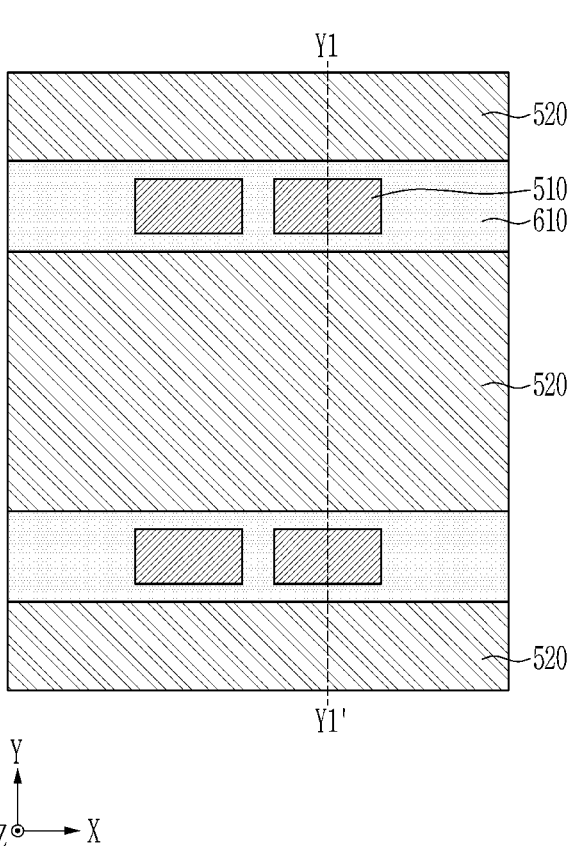
Figure 3B:
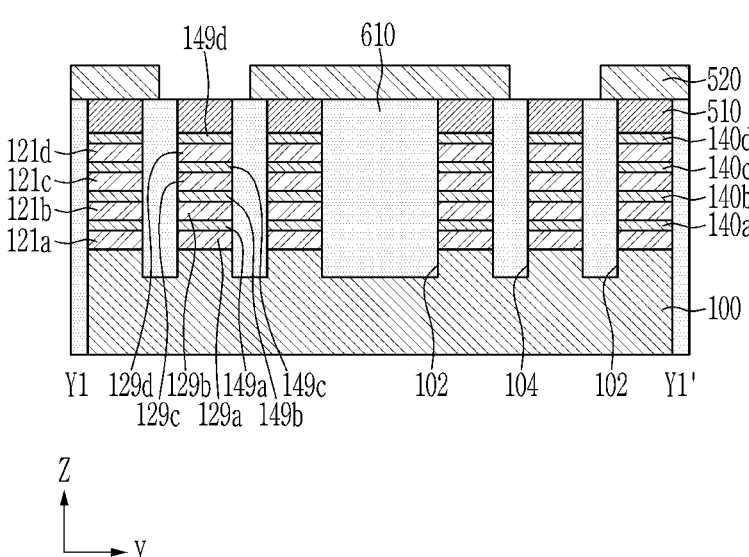

As illustrated in FIGS. 3A and 3B, a photoresist pattern 520 is formed on the nanosheet structure NS with the hard mask pattern 510 thereon.

The photoresist pattern 520 may be formed by applying a photosensitive material on the substrate 100, on which the nanosheet structure NS and the dummy nanosheet structure dNS with the hard mask pattern 510 thereon, and the insulating layer 610 are formed therebetween, and then performing a photoresist process for patterning. After the photoresist process, the photosensitive material disposed on the dummy nanosheet structure dNS with the hard mask pattern 510 thereon may be removed, and the photosensitive material disposed on the nanosheet structure NS with the hard mask pattern 510 thereon may remain. At this time, the photosensitive material formed around the nanosheet structure NS with the hard mask pattern 510 thereon may also remain.

The photoresist pattern 520 may extend in the first direction (x direction). The photoresist pattern 520 may overlap the nanosheet structure NS with the hard mask pattern 510 thereon, and may be wider in the second direction (y direction) than the nanosheet structure NS. Therefore, an upper surface of the nanosheet structure NS may be entirely covered by the photoresist pattern 520 in a plan view. An upper surface of the dummy nanosheet structure dNS with the hard mask pattern 510 thereon may be not covered by the photoresist pattern 520 and may be exposed to the outside. A portion of the insulating layer 610 formed around the dummy nanosheet structure dNS with the hard mask pattern 510 thereon may also be exposed to the outside.

Figure 4A:
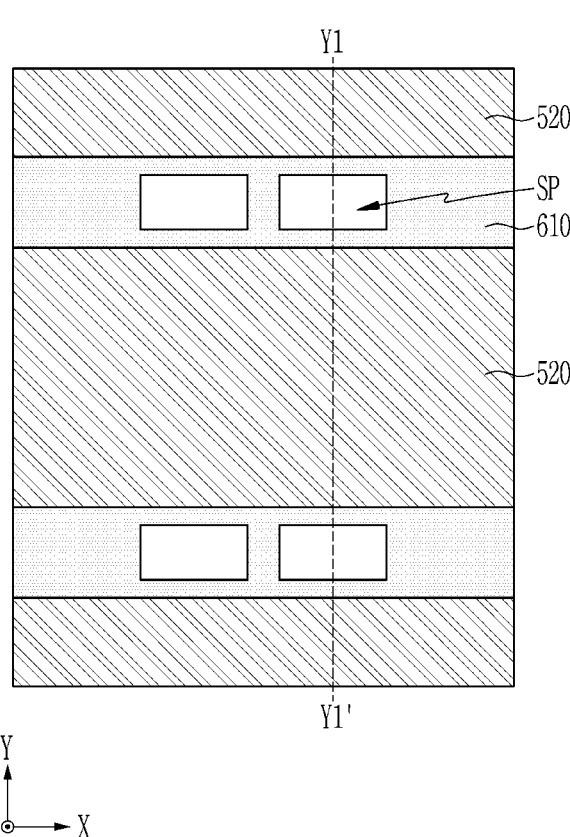
Figure 4B:
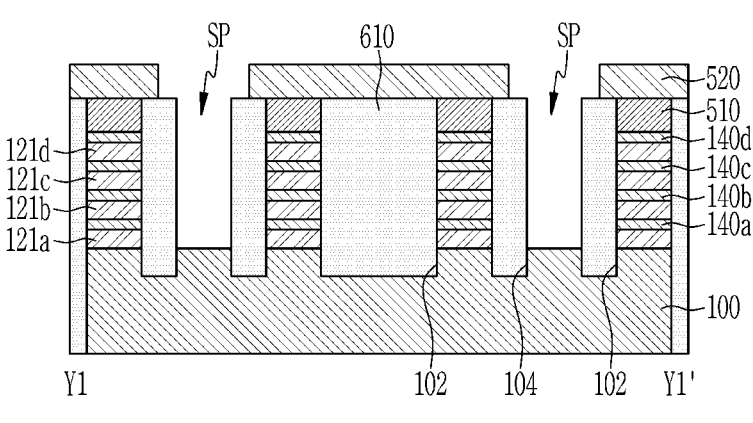
Figure 4B:
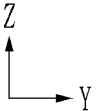

As illustrated in FIGS. 4A and 4B, the dummy nanosheet structure dNS with the hard mask pattern 510 thereon is removed by performing an etching process using the photoresist pattern 520 as a mask. The etching process may be performed using a wet etching method or a dry etching method. A space SP may be formed on the substrate 100 where the dummy nanosheet structure dNS was formed. The dummy pattern 104 that was formed under the dummy nanosheet structure dNS may be exposed to the outside.

The nanosheet structure NS with the hard mask pattern 510 thereon may remain, not removed, because it is covered by the photoresist pattern 520. At least a portion of the insulating layer 610 around the nanosheet structure NS with the hard mask pattern 510 thereon may be exposed to the outside, but may remain, not removed, because it is different in etch rate from the dummy nanosheet structure dNS.

Next, the photoresist pattern 520 is removed.

Figure 5A:
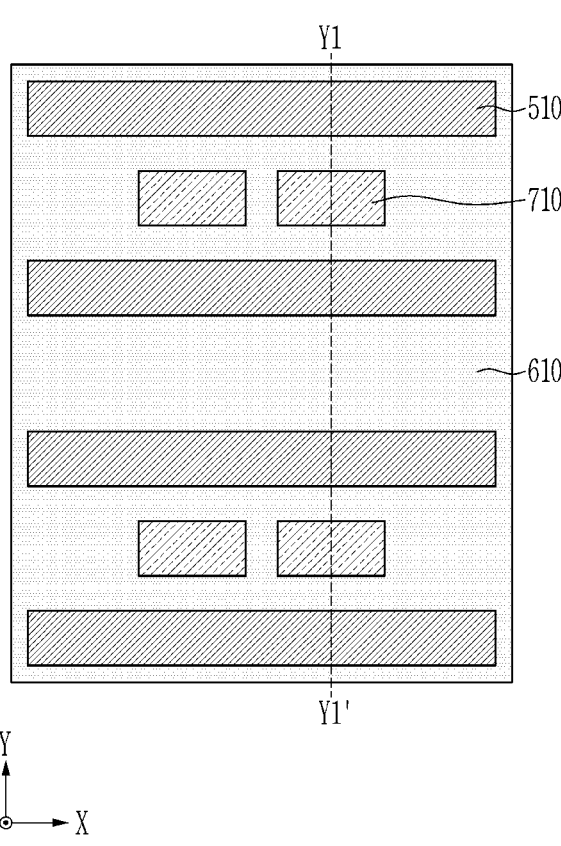
Figure 5B:
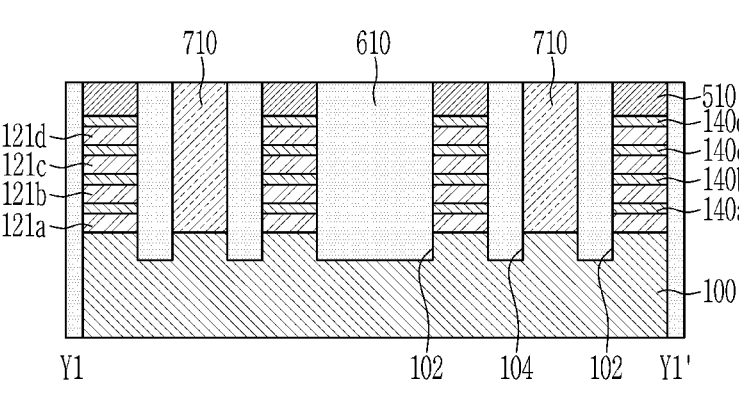
Figure 5B:
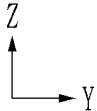

As illustrated in FIGS. 5A and 5B, an isolation pattern 710 is formed in the space SP. The isolation pattern 710 may be formed on the dummy pattern 104. The isolation pattern 710 may contact the dummy pattern 104. A lower surface of the isolation pattern 710 may contact an upper surface of the dummy pattern 104.

The isolation pattern 710 may be formed by depositing an insulating material on the substrate 100, above which the space SP is formed, and an upper surface of the isolation pattern 710 may be planarized by performing a CMP process. Accordingly, the upper surface of the insulating layer 610 may be planarized together with the upper surface of the isolation pattern 710.

The isolation pattern 710 may include silicon nitride (SiN), a low-k dielectric material, or the like. The isolation pattern 710 may be made of a different material from the insulating layer 610. The isolation pattern 710 may be made of a material having a different etch rate from that of the insulating layer 610. For example, the material such as silicon oxide forming the insulating layer 610 may have a higher etch rate than the material such as silicon nitride forming the isolation pattern 710 under a same etching condition, for example, with respect to a same etchant.

A height of the isolation pattern 710 may be determined by a height of the insulating layer 610. The height of the isolation pattern 710 may substantially the same as that of the insulating layer 610. The height of the isolation pattern 710 may be greater than that of the nanosheet structure NS. The height of the isolation pattern 710 may correspond to a height of the nanosheet structure NS with the hard mask pattern 510 thereon.

Figure 6A:
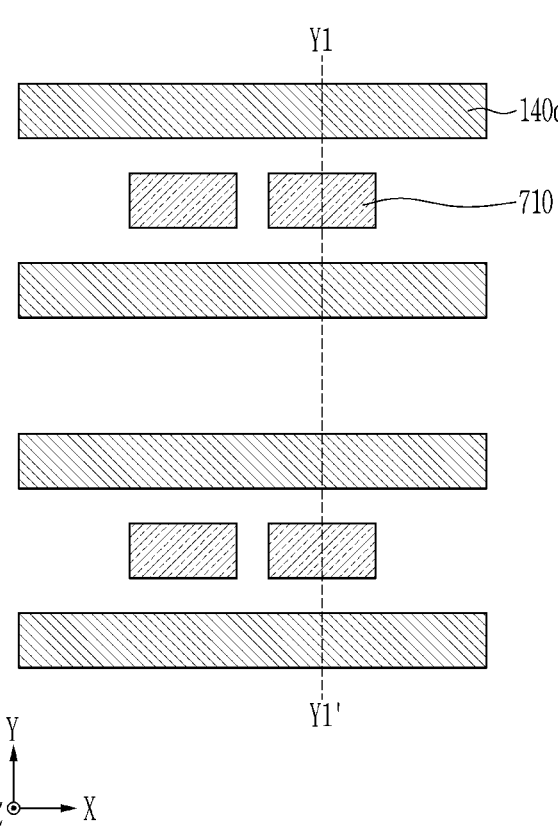
Figure 6B:
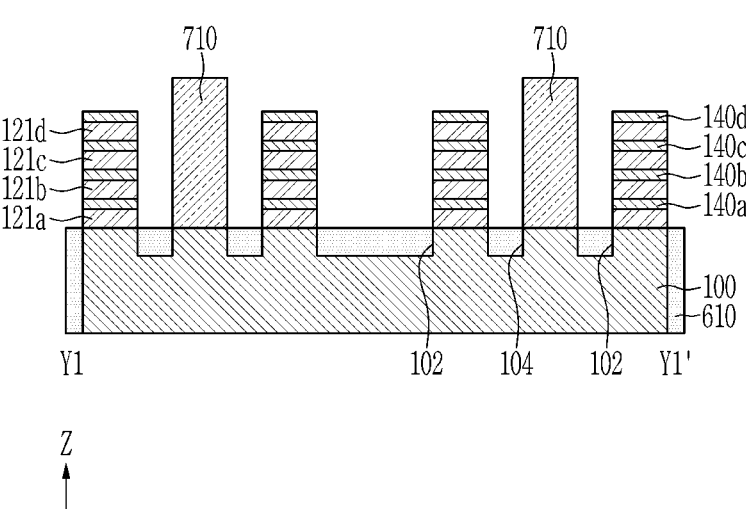

As illustrated in FIGS. 6A and 6B, the hard mask pattern 510 and the insulating layer 610 are removed.

First, the hard mask pattern 510 is removed by performing an etching process after forming a mask pattern capable of covering the isolation pattern 710. Therefore, in the process of removing the hard mask pattern 510, the isolation pattern 710 may not be removed. In addition, the nanosheet structure NS may be made of a material having a different etch rate from that of the hard mask pattern 510. Accordingly, although the upper surface of the nanosheet structure NS is exposed as the hard mask pattern 510 is removed, the nanosheet structure NS may not be removed.

Next, the insulating layer 610 is removed by performing an etching process. The isolation pattern 710 may be formed of a material having an etch rate different from that of the insulating layer 610. Therefore, in the process of removing the insulating layer 610, the isolation pattern 710 may not be removed. At this time, a portion of the insulating layer 610 may remain without completely being removed. The thickness of the insulating layer 610 may be reduced, but the insulating layer 610 may remain to have some of the thickness. The upper surface of the insulating layer 610 may be disposed at a level similar to that of the upper surface of the active pattern 102 and the upper surface of the dummy pattern 104.

As illustrated in FIGS. 7A, 7B, 7C, 7D, and 7E, a main gate sacrificial pattern 123 and a capping layer 530 are formed on the nanosheet structure NS.

After sequentially stacking a material layer for forming the main gate sacrificial pattern 123 and a material layer for forming the capping layer 530 on the substrate 100 on which the nanosheet structure NS and the isolation pattern 710 are formed, the capping layer 530 is formed by patterning the material layer for forming the capping layer 530. Next, the main gate sacrificial pattern 123 is formed by patterning the material layer for forming the main gate sacrificial pattern 123 using the capping layer 530 as a mask. Therefore, the capping layer 530 may have a shape to cover an upper surface of the main gate sacrificial pattern 123, and the main gate sacrificial pattern 123 may have a shape similar to that of the capping layer 530 in a plan view.

The main gate sacrificial pattern 123 may not contact the substrate 100. The insulating layer 610 may be disposed between the substrate 100 and the main gate sacrificial pattern 123.

The main gate sacrificial pattern 123 may be disposed between the fourth semiconductor pattern 140d and the capping layer 530. The main gate sacrificial pattern 123 may be disposed directly on the fourth semiconductor pattern 140d. However, the disclosure is not limited thereto, and another layer may be formed between the main gate sacrificial pattern 123 and the fourth semiconductor pattern 140d. For example, an oxide layer may be formed between the main gate sacrificial pattern 123 and the fourth semiconductor pattern 140d.

In a plan view, a direction in which the main gate sacrificial pattern 123 and the capping layer 530 extend may cross a direction in which the nanosheet structure NS extends. The main gate sacrificial pattern 123 and the capping layer 530 may extend in the second direction (y direction) perpendicular to the first direction (x direction). A plurality of main gate sacrificial patterns 123 may be spaced apart from each other at predetermined intervals in the first direction (x direction).

The main gate sacrificial pattern 123 may include polysilicon, and the capping layer 530 may include silicon nitride. However, the materials of the main gate sacrificial pattern 123 and the capping layer 530 are not limited thereto, and may be variously modified.

Spacers 570 may be further formed on both sides of the main gate sacrificial pattern 123 and the capping layer 530. The spacers 570 may be formed to laterally cover side surfaces of the main gate sacrificial pattern 123 and the capping layer 530. The spacers 570 may include silicon nitride (SiN), a low-k dielectric material, or the like.

As illustrated in FIGS. 8A, 8B, 8C, and 8D, a recess is formed by etching at least a portion of the nanosheet structure NS using the main gate sacrificial pattern 123 and the capping layer 530 as a mask. At this time, the fourth semiconductor pattern 140d, the fourth sub-gate sacrificial pattern 121d, the third semiconductor pattern 140c, the third sub-gate sacrificial pattern 121c, the second semiconductor pattern 140b, the second sub-gate sacrificial pattern 121b, the first semiconductor pattern 140a, and the first sub-gate sacrificial pattern 121a may be sequentially exposed and removed. By forming the recess, side surfaces of the nanosheet structures NS may be exposed to the outside. Also, the upper surface of the substrate 100 may be exposed to the outside.

As a result, the plurality of semiconductor patterns 140a, 140b, 140c, and 140d may be divided to form a plurality of channel patterns 141a, 141b, 141c, and 141d. The plurality of channel patterns 141a, 141b, 141c, and 141d may be disposed on both sides of the recess. The plurality of channel patterns 141a, 141b, 141c, and 141d may include a first channel pattern 141a, a second channel pattern 141b, a third channel pattern 141c, and a fourth channel pattern 141d. The plurality of channel patterns 141a, 141b, 141c, and 141d and the plurality of sub-gate sacrificial patterns 121a, 121b, 121c, and 121d may be alternately stacked. The first sub-gate sacrificial pattern 121a, the first channel pattern 141a, the second sub-gate sacrificial pattern 121b, the second channel pattern 141b, the third sub-gate sacrificial pattern 121c, the third channel pattern 141c, the fourth sub-gate sacrificial pattern 121d, and the fourth channel pattern 141d may be sequentially disposed. At this time, the first channel pattern 141a, the second channel pattern 141b, the third channel pattern 141c, and the fourth channel pattern 141d may have the same length or different lengths.

Next, a source/drain pattern 170 is formed in the recess. The source/drain pattern 170 may be formed using an epitaxial growth method. At this time, an inner wall of the recess may be used as a seed. The inner wall of the recess is formed by the side surfaces of the plurality of channel patterns 141a, 141b, 141c, and 141d and the plurality of sub-gate sacrificial patterns 121a, 121b, 121c, and 121d, and the upper surface of the substrate 100. The source/drain pattern 170 may include silicon germanium (SiGe). However, the material of the source/drain pattern 170 is not limited thereto, and may be variously modified.

As illustrated in FIGS. 9A, 9B, 9C, and 9D, an insulating layer 620 is formed on the source/drain pattern 170. The insulating layer 620 may be formed to fill an area between the plurality of main gate sacrificial patterns 123. The insulating layer 620 may be formed on top and side surfaces of the source/drain pattern 170. The insulating layer 620 may be made of an insulating material capable of filling an empty space well. For example, the insulating layer 620 may include silicon oxide, Tonen SilaZene (TOSZ), or the like. The insulating layer 620 may be positioned on the previously formed insulating layer 610. The insulating layer 620 may be made of the same material as the previously formed insulating layer 610. However, the material of the insulating layer 620 is not limited thereto, and the two insulating layers 610 and 620 may be made of different materials.

Next, an upper surface of the insulating layer 620 is planarized using a CMP process. Accordingly, the upper surface of the isolation pattern 710 may be planarized together with the upper surface of the insulating layer 620. Also, an upper surface of the capping layer 530 may be planarized together with the upper surface of the insulating layer 620.

A height of the isolation pattern 710 may be substantially the same as that of the insulating layer 620. The height of the isolation pattern 710 may correspond to a height of a combined structure including the nanosheet structure NS, the main gate sacrificial pattern 123, and the capping layer 530.

As illustrated in FIGS. 10A, 10B, 10C, 10D, and 10E, the capping layer 530, the main gate sacrificial pattern 123, and the plurality of sub-gate sacrificial patterns 121a, 121b, 121c, and 121d are removed.

When the capping layer 530 is removed, the main gate sacrificial pattern 123 may be exposed to the outside. The exposed main gate sacrificial pattern 123 may be removed using an etching process. As the main gate sacrificial pattern 123 is removed, the plurality of sub-gate sacrificial patterns 121a, 121b, 121c, and 121d may be exposed to the outside. The exposed plurality of sub-gate sacrificial patterns 121a, 121b, 121c, and 121d may be removed using an etching process.

Next, gate electrodes 127 are formed in spaces where the main gate sacrificial pattern 123 and the plurality of sub-gate sacrificial patterns 121a, 121b, 121c, and 121d are removed. The gate electrodes 127 may include a plurality of sub-gate electrodes 127Sa, 127Sb, 127Sc, and 127Sd and a main gate electrode 127M.

Although not illustrated, a gate insulating layer may be formed prior to forming the gate electrodes 127. The gate insulating layer may be conformally formed on surfaces exposed by the spaces where the main gate sacrificial pattern 123 and the plurality of sub-gate sacrificial patterns 121a, 121b, 121c, and 121d are removed.

The plurality of sub-gate electrodes 127Sa, 127Sb, 127Sc, and 127Sd are disposed in the spaces where the plurality of sub-gate sacrificial patterns 121a, 121b, 121c, and 121d are removed. The plurality of sub-gate electrodes 127Sa, 127Sb, 127Sc, and 127Sd are formed on the gate insulating layer to fill the spaces. The plurality of sub-gate electrodes 127Sa, 127Sb, 127Sc, and 127Sd may include a first sub-gate electrode 127Sa, a second sub-gate electrode 127Sb, a third sub-gate electrode 127Sc, and a fourth sub-gate electrode 127Sd. The first sub-gate electrode 127Sa is formed in a space where the first sub-gate sacrificial pattern 121a is removed, the second sub-gate electrode 127Sb is formed in a space where the second sub-gate sacrificial pattern 121b is removed, the third sub-gate electrode 127Sc is formed in a space where the third sub-gate sacrificial pattern 121c is removed, and the fourth sub-gate electrode 127Sd is formed in a space where the fourth sub-gate sacrificial pattern 121d is removed. Accordingly, the plurality of channel patterns 141a, 141b, 141c, and 141d and the plurality of sub-gate electrodes 127Sa, 127Sb, 127Sc, and 127Sd may be alternately stacked. On the first sub-gate electrode 127Sa, the first channel pattern 141a, the second sub-gate electrode 127Sb, the second channel pattern 141b, the third sub-gate electrode 127Sc, the third channel pattern 141c, the fourth sub-gate electrode 127Sd, and the fourth channel pattern 141d may be sequentially formed. The gate insulating layer may be extended to be formed between each of the sub-gate electrodes 127Sa, 127Sb, 127Sc, and 127Sd and each of the channel patterns 141a, 141b, 141c, and 141d. the gate insulating layer may also be formed between each of the sub-gate electrodes 127Sa, 127Sb, 127Sc, and 127Sd and the source/drain pattern 170.

The main gate electrode 127M is formed in the space where the main gate sacrificial pattern 123 is removed. The main gate electrode 127M is formed on the gate insulating layer to fill the space. The main gate sacrificial pattern 123 may be formed in a shape like a single bar extending in the second direction (y direction), and the main gate electrode 127M may be formed in a shape like a plurality of bars extending in the second direction (y direction) and spaced apart from each other in the second direction (y direction). A gate cut pattern GCT may be positioned between the main gate electrodes 127M spaced apart in the second direction (y direction). Sidewalls of the gate cut pattern GCT may contact the gate electrodes 127 in the second direction (y direction). Also, the gate cut pattern GCT may contact the gate insulating layer extending in the second direction (y direction) along a lower surface of the gate electrode 127. The gate cut pattern GCT may include at least one of silicon oxide and silicon nitride.

The gate electrode 127 may be formed using an atomic layer deposition (ALD) process, a chemical vapor deposition (CVD) process, or the like. The gate electrode 127 may include doped polysilicon, metal, conductive metal nitride, conductive metal carbide, or a combination thereof. However, this is merely an example, and the material of the gate electrode 127 is not limited thereto.

Next, a capping layer 540 is formed on the main gate electrode 127M. The capping layer 540 may cover an upper surface of the main gate electrode 127M, and may have a shape similar to that of the main gate electrode 127M in a plan view. An upper surface of the capping layer 540 may be planarized with the upper surface of the insulating layer 620.

As illustrated in FIGS. 11A, 11B, 11C, and 11D, a photoresist pattern 550 is formed on the capping layer 540 and the insulating layer 620.

The photoresist pattern 550 may be formed by applying a photosensitive material on the substrate 100, on which the gate electrode 127, the capping layer 540, the insulating layer 620, and the isolation pattern 710 are formed, and patterning the photosensitive material by performing a photoresist process.

The photoresist pattern 550 may include an opening 551. The opening 551 of the photoresist pattern 550 may extend in the second direction (y direction) in a plan view. The opening 551 of the photoresist pattern 550 may overlap at least a portion of the source/drain pattern 170, at least a portion of the isolation pattern 710, and at least a portion of the insulating layer 620. The capping layer 540 may be entirely covered by the photoresist pattern 550. At least a portion of the isolation pattern 710 and at least a portion of the insulating layer 620 may be exposed to the outside, without being covered by the photoresist pattern 550.

A width of the opening 551 of the photoresist pattern 550 in the first direction (x direction) may be smaller than a length of the isolation pattern 710 in the first direction (x direction). The width of the opening 551 of the photoresist pattern 550 in the first direction (x direction) may be smaller than a distance between main gate electrodes 127M adjacent to each other in the first direction (x direction).

As illustrated in FIGS. 12A, 12B, 12C, and 12D, the insulating layer 620 formed in a space corresponding to the opening 551 of the photoresist pattern 550 is removed.

An etching process is performed in a state where at least a portion of the isolation pattern 710 and at least a portion of the insulating layer 620 are exposed by the opening 551 of the photoresist pattern 550. The isolation pattern 710 may be made of a material having a different etch rate from that of the insulating layer 620. Therefore, in the process of removing the insulating layer 620, the isolation pattern 710 may not be removed. By removing at least a portion of the insulating layer 620, the source/drain pattern 170 may be exposed to the outside. Although not illustrated, a metal silicide film may be formed on the source/drain pattern 170 to reduce a contact resistance.

Next, a contact structure 720 connected to the source/drain pattern 170 is formed.

The contact structure 720 is formed by depositing a conductive material in a state where at least a portion of the source/drain pattern 170 is exposed. The contact structure 720 may be formed to fill a portion where the insulating layer 620 is removed. The contact structure 720 may be formed to cover an upper surface and side surfaces of the source/drain pattern 170. The contact structure 720 may include tungsten (W), cobalt (Co), titanium (Ti), an alloy thereof, or a combination thereof. The contact structure 720 may directly contact the source/drain pattern 170. However, the disclosure is not limited thereto, and another conductive member may be further positioned between the contact structure 720 and the source/drain pattern 170. For example, a conductive barrier or the like may be further formed to prevent the contact structure 720 from being diffused. The conductive barrier may be conformally formed using an atomic layer deposition (ALD) process, a chemical vapor deposition (CVD) process, or the like. The conductive barrier may include TIN, TaN, AlN, WN, and a combination thereof.

Although not illustrated, a pin spacer may be positioned on both sides of the active pattern 102 formed below the source/drain pattern 170. By forming the pin spacer to cover the side surface of the active pattern 102, the pin spacer may be formed between the active pattern 102 and the contact structure 720. That is, the active pattern 102 may not directly contact the contact structure 720. The pin spacer may also be formed between the active pattern 102 and the insulating layer 610.

Next, the upper surface of the contact structure 720 may be planarized by performing a chemical mechanical polishing (CMP) process. Accordingly, the upper surface of the isolation pattern 710 may be planarized together with the upper surface of the contact structure 720. Also, the upper surface of the insulating layer 620 and the upper surface of the capping layer 540 may be planarized together with the upper surface of the contact structure 720.

A height of the isolation pattern 710 may be substantially the same as that of the contact structure 720. Adjacent contact structures 720 may be isolated from each other by the isolation pattern 710. The height of the isolation pattern 710 may correspond to a height of a combined structure including the plurality of channel patterns 141a, 141b, 141c, and 141d, the plurality of sub-gate electrodes 127Sa, 127Sb, 127Sc, and 127Sd, the main gate electrode 127M, and the capping layer 540.

In the method for manufacturing a semiconductor device according to an embodiment, a dummy nanosheet structure may be formed in the step of forming a nanosheet structure, and an isolation pattern may be formed in a space generated by removing the dummy nanosheet structure. Next, a source/drain pattern, a gate electrode, etc., are sequentially formed, and then an insulating layer around the isolation pattern may be removed to form a contact structure connected to the source/drain pattern.

In this manner, by forming the isolation pattern at the beginning of the manufacturing method, it is possible to prevent influences of dispersion, step difference, etc., which may occur in the subsequent processes. Therefore, by self-aligning an isolation pattern formation position, an isolation pattern can be accurately formed and a short circuit between adjacent contact structures can be prevented. In addition, in the process of removing the insulating layer around the isolation pattern to secure a space for forming the contact structure, a wet etching process as well as a dry etching process may be used.

Next, a semiconductor device according to an embodiment manufactured by the manufacturing method described above with reference to FIGS. 12A to 12D will be described.

The semiconductor device according to an embodiment includes a substrate 100, a plurality of channel patterns 141a, 141b, 141c, and 141d formed on the substrate 100, gate electrodes 127 surrounding the plurality of channel patterns 141a, 141b, 141c, and 141d, source/drain patterns 170 formed on both sides of the plurality of channel patterns 141a, 141b, 141c, and 141d, an isolation pattern 710 formed between the source/drain patterns 170, and a contact structure 720 connected to each of the source/drain patterns 170.

The gate electrode 127 may include a plurality of sub-gate electrodes 127Sa, 127Sb, 127Sc, and 127Sd and a main gate electrode 127M. The plurality of sub-gate electrodes 127Sa, 127Sb, 127Sc, and 127Sd and the plurality of channel patterns 141a, 141b, 141c, and 141d may be alternately stacked. At least a portion of the main gate electrode 127M may be formed on a structure in which the plurality of sub-gate electrodes 127Sa, 127Sb, 127Sc, and 127Sd and the plurality of channel patterns 141a, 141b, 141c, and 141d are stacked. The other portion of the main gate electrode 127M may be formed to cover both sides of the structure in which the plurality of sub-gate electrodes 127Sa, 127Sb, 127Sc, and 127Sd and the plurality of channel patterns 141a, 141b, 141c, and 141d are stacked. At this time, the main gate electrodes 127M may be formed on both sides of the channel patterns 141a, 141b, 141c, and 141d in the second direction (y direction). The four surfaces of the plurality of channel patterns 141a, 141b, 141c, and 141d may be surrounded by the gate electrodes 127.

The source/drain patterns 170 may be formed to cover both sides of the structure in which the plurality of sub-gate electrodes 127Sa, 127Sb, 127Sc, and 127Sd and the plurality of channel patterns 141a, 141b, 141c, and 141d are stacked. At this time, the source/drain patterns 170 may be formed on both sides of the channel panels 141a, 141b, 141c, and 141d in the first direction (x direction).

The isolation pattern 710 may be formed between main gate electrodes 127M adjacent to each other in the first direction (x direction) in a plan view. In addition, the isolation pattern 710 may be formed between the source/drain patterns 170 adjacent to each other in the second direction (y direction) in a plan view.

A height of the isolation pattern 710 may be greater than that of the gate electrode 127. In this case, the height of the isolation pattern 710 refers to a distance from a lower surface of the substrate 100 to an upper surface of each of the isolation pattern 710 and the gate electrode 127. A capping layer 540 may be formed on the main gate electrode 127M, and the height of the isolation pattern 710 may correspond to a height of the capping layer 540. For example, the upper surface of the isolation pattern 710 may be substantially at the same level in the third direction (z direction) as the upper surface of the capping layer 540.

The contact structure 720 may be connected to the source/drain pattern 170. The contact structure 720 may be formed on an upper surface and side surfaces of the source/drain pattern 170.

A height of the contact structure 720 may correspond to the height of the isolation pattern 710. For example, an upper surface of the contact structure 720 may be substantially at the same level as the upper surface of the isolation pattern 710. The isolation pattern 710 may be disposed between contact structures 720 adjacent to each other in the second direction (y direction) in a plan view. The contact structures 720 adjacent to each other in the second direction (y direction) may be isolated from each other by the isolation pattern 710. That is, the isolation pattern 710 can prevent a short circuit between contact structures 720 adjacent to each other in the second direction (y direction).

Next, a semiconductor device according to an embodiment will be described below with reference to FIG. 13.

Figure 13:
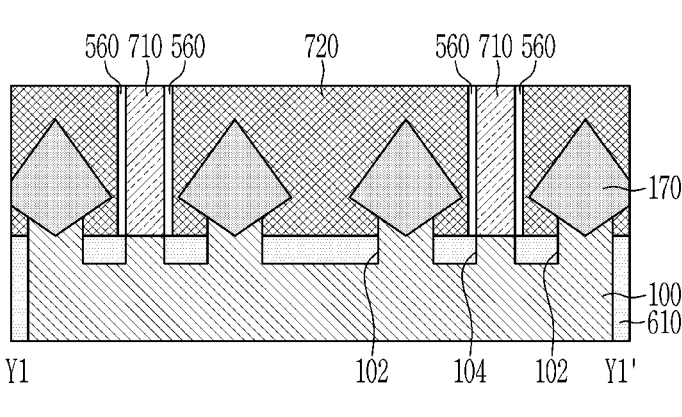
FIG. 13 is a cross-sectional view illustrating a semiconductor device, according to an embodiment.
Figure 13:
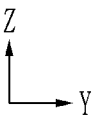

FIG. 13 is a cross-sectional view illustrating a semiconductor device according to an embodiment.

Many parts in the embodiment illustrated in FIG. 13 are the same as corresponding parts in the embodiment illustrated in FIGS. 12A to 12D. Thus, the description for the same parts will be omitted and a difference will be mainly described. In addition, the same reference signs will be used for components that are the same as those in the previous embodiment. The present embodiment is different from the previous embodiment in that a spacer is further positioned between the isolation pattern and the contact structure, and the difference will be described below.

A semiconductor device according to an embodiment includes a substrate 100, source/drain patterns 170 positioned on the substrate 100, an isolation pattern 710 positioned between the source/drain patterns 170, and a contact structure 720 connected to each of the source/drain patterns 170.

While the isolation pattern 710 may contact the contact structure 720 in the previous embodiment, the isolation pattern 710 may not contact the contact structure 720 in the present embodiment. A spacer 560 may be formed between the isolation pattern 710 and the contact structure 720. Although it is illustrated in FIG. 13 that the spacer 560 is formed of one layer, the disclosure is not limited thereto and may be formed of a plurality of layers.

Figure 7A:
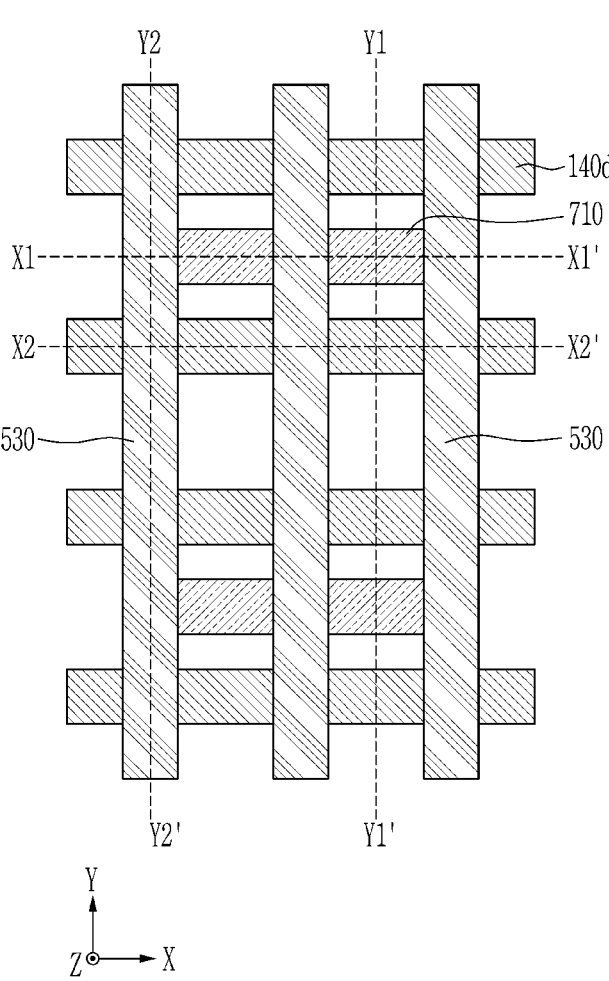
Figure 7B:
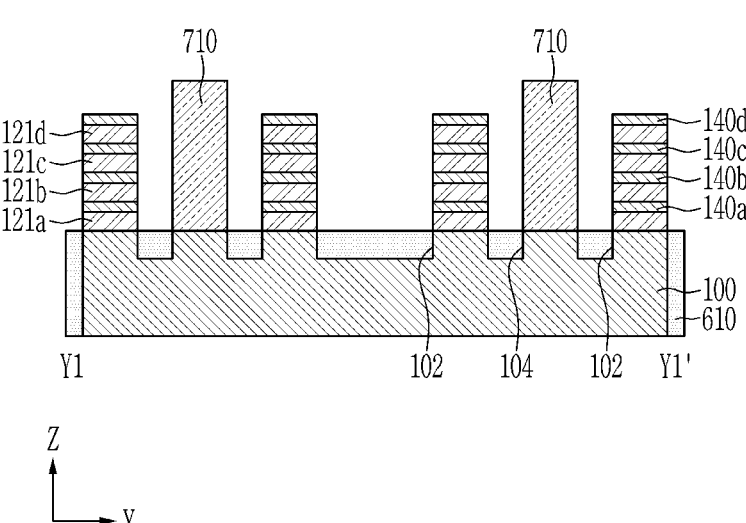
Figure 7C:
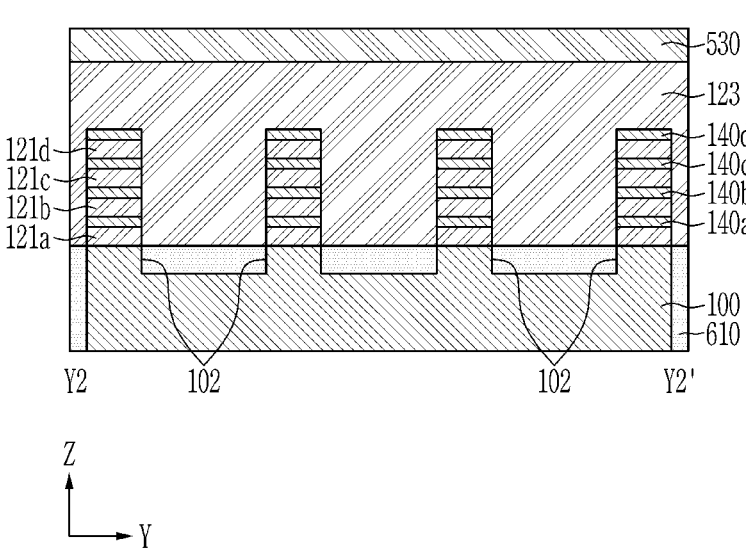
Figure 7D:
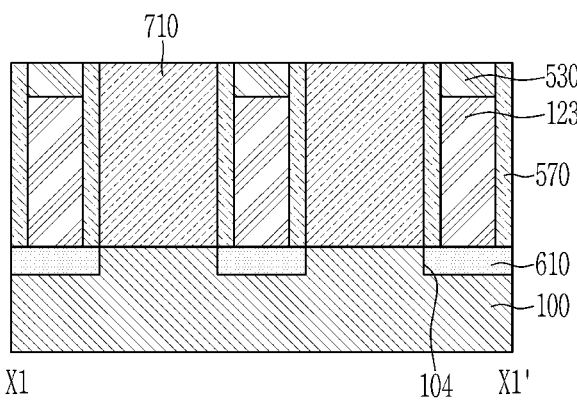
FIGS. 7D, 10D, and 11C are cross-sectional views taken along lines X1-X1' of the respective plan views.
Figure 7D:
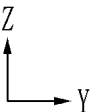
Figure 7E:
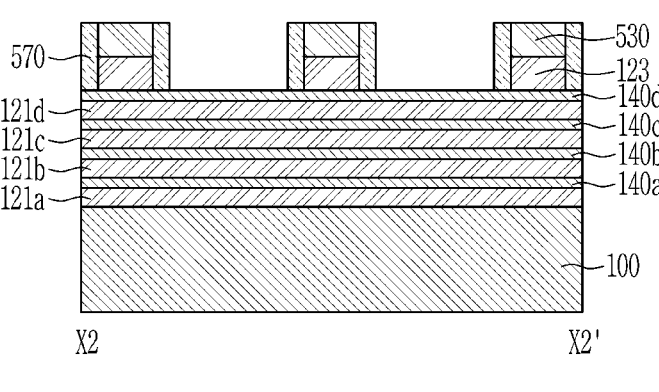
FIGS. 7E, 8D, 9D, 10E, 11D, and 12D are cross-sectional views taken along lines X2-X2' of the respective plan views.
Figure 8A:
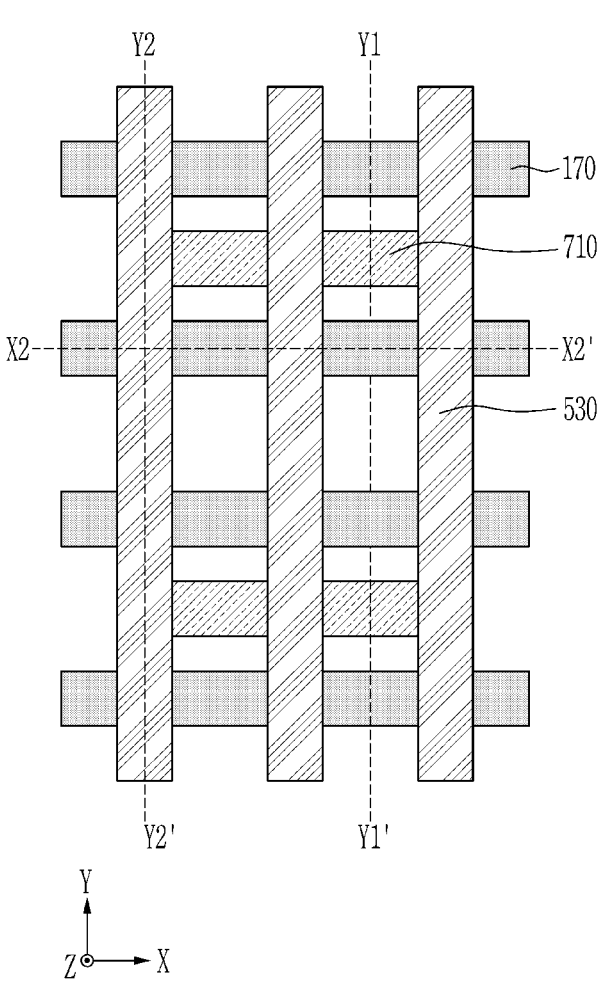
Figure 8B:
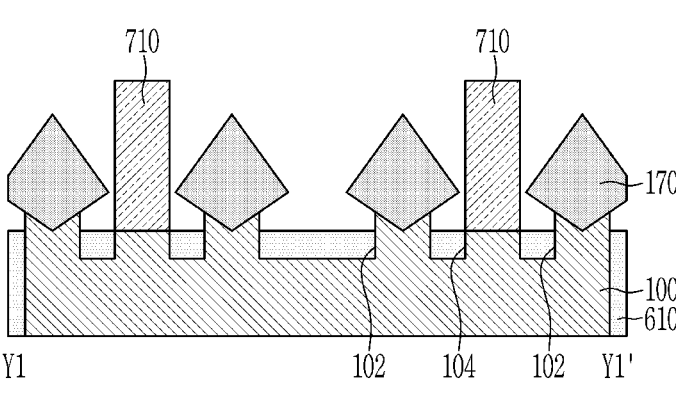
Figure 8B:
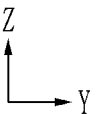
Figure 8C:
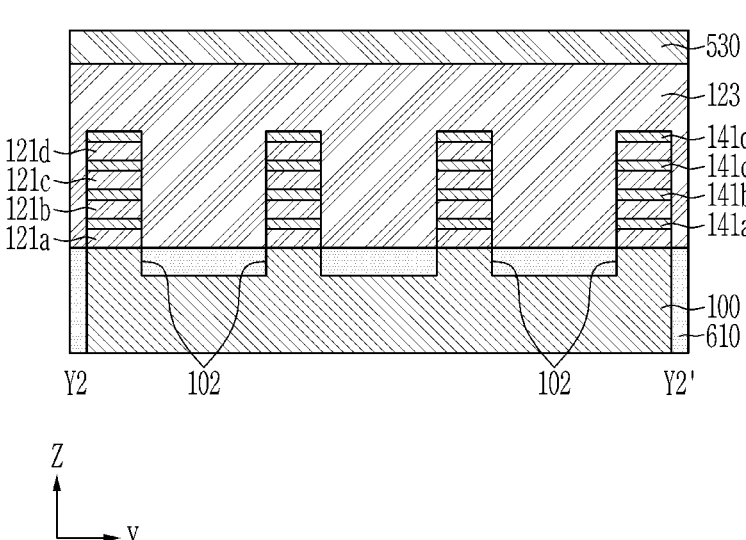
Figure 8D:
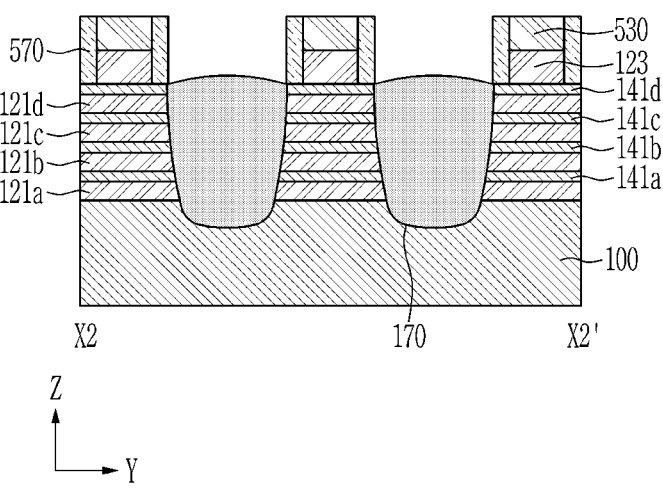
Figure 9A:
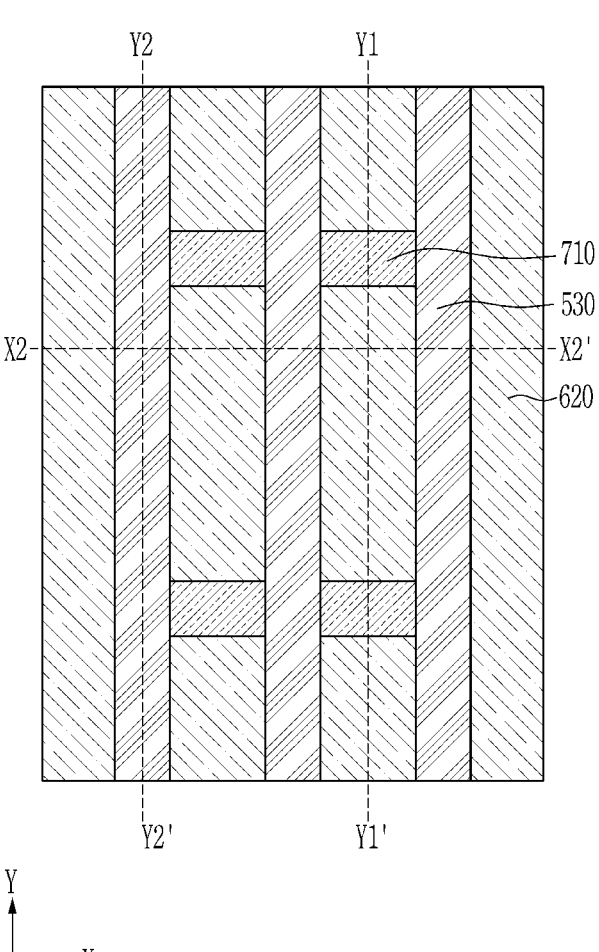
Figure 9B:
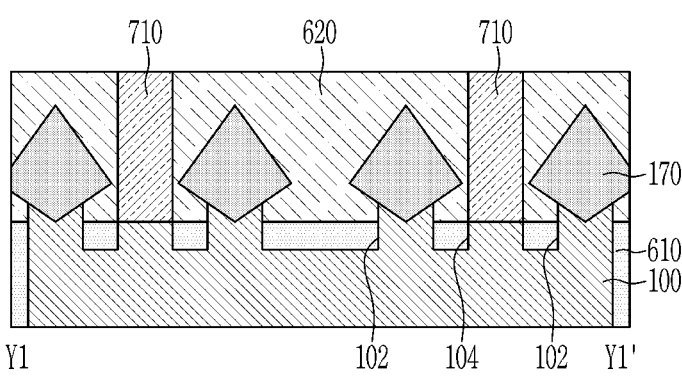
Figure 9B:
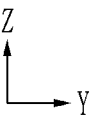
Figure 9C:
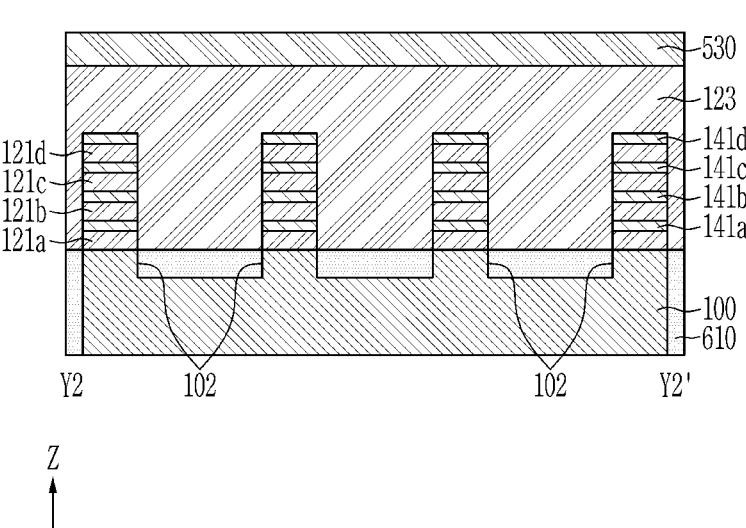
Figure 9D:
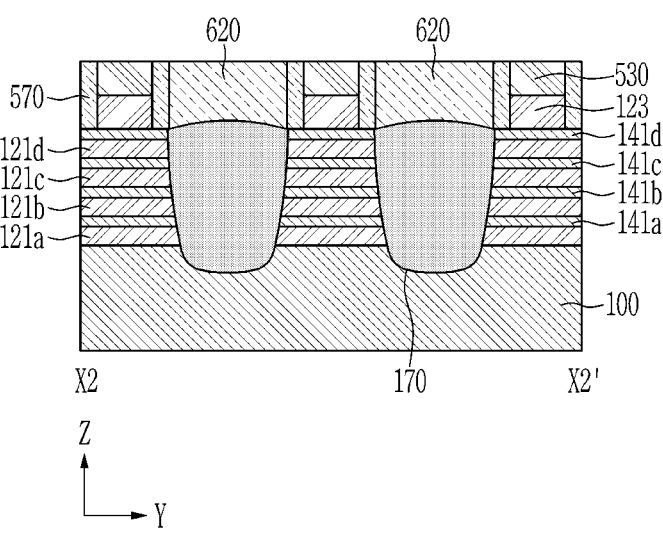

In a process of manufacturing the semiconductor device according to an embodiment, after the main gate sacrificial pattern 123 (in FIG. 7B) is formed, the spacer 570 (in FIG. 7B) is formed on a side surface of the main gate sacrificial pattern 123 (in FIG. 7B). In this process, the spacer 560 on a side surface of the isolation pattern 710 may be formed together with the isolation pattern 710. Alternatively, the spacer 560 covering a side surface of the isolation pattern 710 may be formed together in a process of forming the insulating layer covering the source/drain pattern 170 after the source/drain pattern 170 is formed.

The spacer 560 may include silicon nitride (SiN), a low-k dielectric material, or the like, which may be the same as or different from the silicon nitride forming the isolation pattern 710. However, as the isolation pattern 710 and the spacer 560 may be formed at different steps or through different processes as described above, an interface, for example, a visible interface, may be formed between the isolation pattern 710 and the spacer 560.

Next, a semiconductor device according to an embodiment will be described below with reference to FIG. 14.

Figure 14:
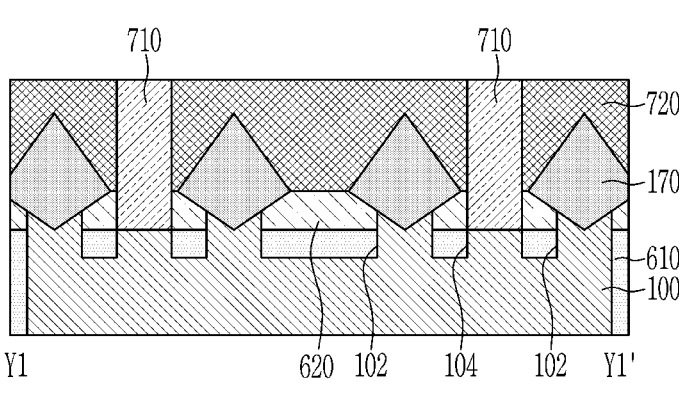
FIG. 14 is a cross-sectional view illustrating a semiconductor device, according to an embodiment.
Figure 14:
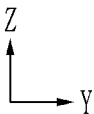

FIG. 14 is a cross-sectional view illustrating a semiconductor device according to an embodiment.

Many parts in the embodiment illustrated in FIG. 14 are the same as corresponding parts in the embodiment illustrated in FIGS. 12A to 12D. Thus, the description for the same parts will be omitted and a difference will be mainly described. In addition, the same reference signs will be used for components that are the same as those in the previous embodiment. The present embodiment is partially different from the previous embodiment in a region where the contact structure 720 is formed, and the difference will be described below.

A semiconductor device according to an embodiment includes a substrate 100, source/drain patterns 170 formed on the substrate 100, an isolation pattern 710 formed between the source/drain patterns 170, and a contact structure 720 connected to each of the source/drain patterns 170.

In the previous embodiment, the insulating layer 620 covering the source/drain pattern 170 may be almost removed, and the contact structure 720 may be formed in a space where the insulating layer 620 was formed. Accordingly, the contact structure 720 may almost cover a side surface of the source/drain pattern 170, and a lower surface of the contact structure 720 may be formed at a similar level to the lower surface of the isolation pattern 710.

In the present embodiment, the insulating layer 620 covering the source/drain pattern 170 may remain up to a predetermined height. The contact structure 720 may be formed in a space where the insulating layer 620 is removed. Accordingly, a portion of the side surface of the source/drain pattern 170 may be covered by the contact structure 720 and the other portion of the side surface of the source/drain pattern 170 may be covered by the insulating layer 620. In this case, the lower surface of the isolation pattern 710 may be positioned at a lower level than the lower surface of the contact structure 720.

Next, a semiconductor device according to an embodiment will be described below with reference to FIGS. 15A, 15B, and 15C.

Figure 15A:
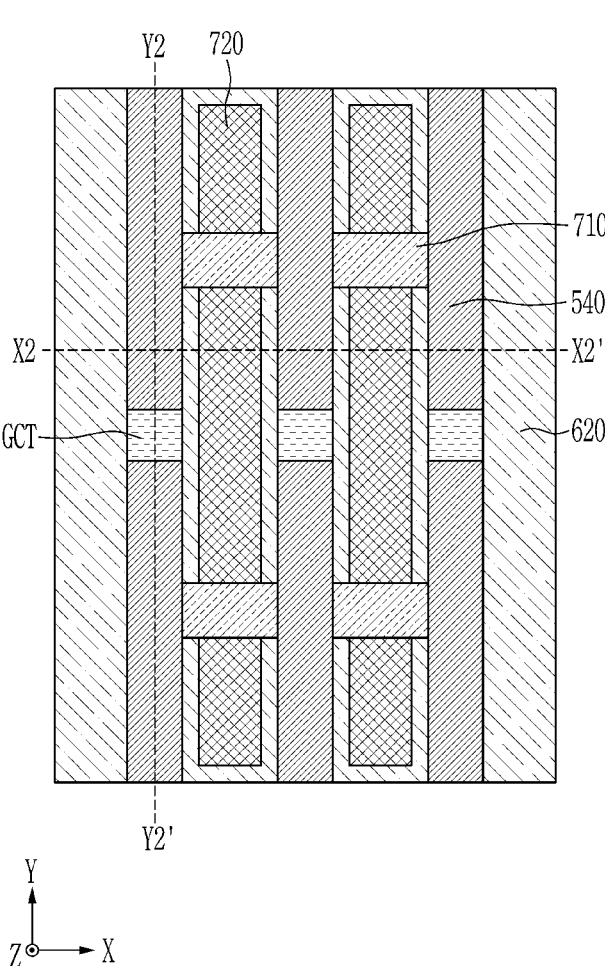
FIG. 15A is a plan view illustrating a semiconductor device, according to an embodiment.
Figure 15B:
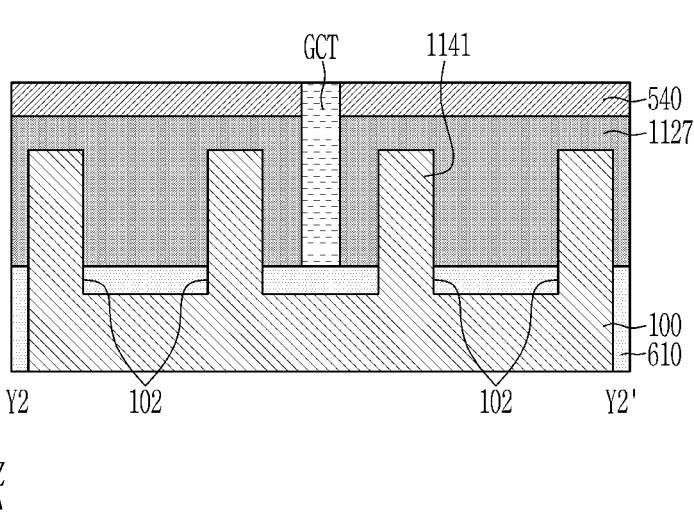
FIG. 15B is a cross-sectional view taken along line Y1-Y1' of FIG. 15A.
Figure 15C:
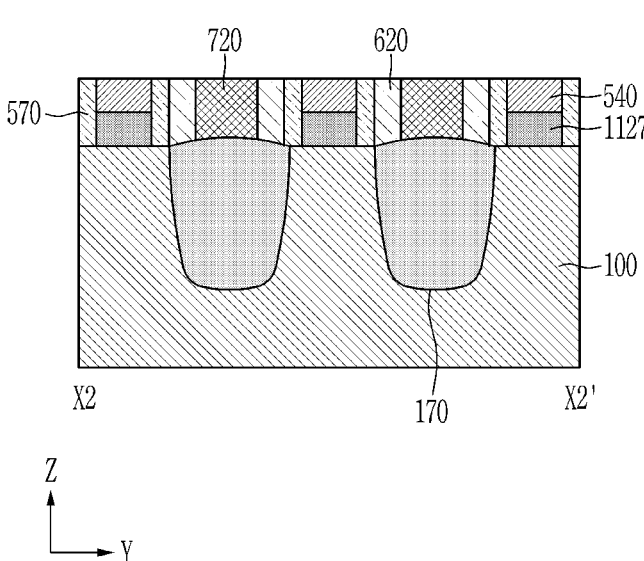
FIG. 15C is a cross-sectional view taken along line X2-X2' of FIG. 15A.

FIG. 15A is a plan view illustrating a semiconductor device according to an embodiment, FIG. 15B is a cross-sectional view taken along line Y1-Y1' of FIG. 15A, and FIG. 15C is a cross-sectional view taken along line X2-X2' of FIG. 15A.

Many parts in the embodiment illustrated in FIGS. 15A to 15C are the same as corresponding parts in the embodiment illustrated in FIGS. 12A to 12D. Thus, the description for the same parts will be omitted and a difference will be mainly described. In addition, the same reference signs will be used for components that are the same as those in the previous embodiment. The present embodiment is different from the previous embodiment in that the sub-gate electrodes are omitted, and the difference will be described below.

As illustrated in FIGS. 15A, 15B, and 15C, a semiconductor according to an embodiment includes a substrate 100, a channel pattern 1141 formed on the substrate 100, and a gate electrode 1127 surrounding the channel pattern 1141, source/drain patterns 170 formed on both sides of the channel pattern 1141, an isolation pattern 710 formed between the source/drain patterns 170, and a contact structure 720 connected to each of the source/drain patterns 170.

In the previous embodiment, the gate electrodes may include a plurality of sub-gate electrodes and a main gate electrode, the plurality of sub-gate electrodes may be alternately stacked with a plurality of channel patterns, and four sides of the channel patterns may be surrounded by the gate electrodes. In the present embodiment, the structure in which the plurality of sub-gate electrodes and the plurality of channel patterns are stacked is omitted, and three sides of the channel pattern 1141 may be surrounded by the gate electrode 1127.

In the previous embodiment, an isolation pattern may be formed in a space generated by removing a dummy nanosheet structure after the dummy nanosheet structure is formed in the step of forming a nanosheet structure in which a plurality of sub-gate sacrificial patterns and a plurality of semiconductor patterns are stacked. In the present embodiment, an isolation pattern may be formed in a space generated by removing a dummy semiconductor pattern after the dummy semiconductor pattern is formed in the step of forming a semiconductor pattern for forming a channel pattern.

In the above embodiments, a plurality of nanosheet stacks forming nanosheet transistors are provided to describe a method of manufacturing a semiconductor device. However, the disclosure is not limited thereto, and vertical fin structures forming a plurality of fin field-effect transistors (Fin-FETs) or other type of channel structure may be provided to implement the method of manufacturing a device described above.

Although the exemplary embodiments have been described in detail above, the scope of the disclosure is not limited thereto, and various modifications and improvements made by those skilled in the art using the basic concept of the disclosure defined in the following claims also fall within the scope of the disclosure.

What is claimed is:

1. A method for manufacturing a semiconductor device, the method comprising:

forming semiconductor structures and a dummy structure extending in a first direction on a substrate;

forming a first insulating layer between the semiconductor structures and the dummy structure;

forming a first space in the first insulating layer by removing the dummy structure;

forming an isolation pattern in the first space in the first insulating layer;

forming a main gate sacrificial pattern extending in a second direction crossing the first direction to overlap the semiconductor structures;

forming second spaces by removing portions of the semiconductor structures at both sides of the main gate sacrificial pattern, and forming source/drain patterns in the second spaces;

forming a second insulating layer on the source/drain patterns;

forming a third space by removing the main gate sacrificial pattern, and forming a gate electrode in the third space; and forming fourth spaces by removing the second insulating layer, and forming, in the fourth spaces, contact structures connected to the source/drain patterns and disposed on both sides of the isolation pattern.

2. The method of claim 1, wherein the isolation pattern includes a silicon oxide or a low-k dielectric material.

3. The method of claim 1, further comprising removing the first insulating layer against the isolation pattern prior to the forming the source/drain patterns, wherein a material forming the first insulating layer has a higher etch rate than a material forming the isolation pattern.

4. The method of claim 1, wherein an upper surface of the isolation pattern is at a level higher than upper surfaces of the semiconductor structures.

5. The method of claim 1, wherein an upper surface of the isolation pattern is at a level higher than an upper surface of the gate electrode.

6. The method of claim 1, wherein the semiconductor structures and the dummy structure comprise a same material.

7. The method of claim 6, wherein the forming the semiconductor structures and the dummy structure comprises:

alternately stacking a first material layer and a second material layer on the substrate;

forming a hard mask pattern on the stacked first material layer and second material layer; and forming the semiconductor structures and the dummy structure by patterning the first material layer and the second material layer based on the hard mask pattern.

8. The method of claim 7, wherein the first material layer comprises silicon germanium, and the second material layer comprises silicon.

9. The method of claim 7, wherein each of the semiconductor structures comprises a plurality of sub-gate sacrificial patterns and a plurality of semiconductor patterns, and wherein the dummy structure comprises a plurality of dummy gate sacrificial patterns and a plurality of dummy semiconductor patterns.

10. The method of claim 1, further comprising, after the forming the isolation pattern, removing the first insulating layer.

11. The method of claim 1, wherein the forming the first space comprises:

forming a first photoresist pattern on the semiconductor structures among the semiconductor structures and the dummy structure; and removing the dummy structure by performing an etching process based on the first photoresist pattern.

12. The method of claim 11, wherein the first photoresist pattern is formed on a portion of the first insulating layer disposed adjacent to the semiconductor structures without being formed on a portion of the first insulating layer disposed adjacent to the dummy structure, and the first insulating layer is not removed in the etching process.

13. The method of claim 1, wherein the forming the contact structures comprises:

forming a second photoresist pattern on the second insulating layer such that an opening overlapping the isolation pattern and the source/drain patterns is obtained;

removing the second insulating layer based on the second photoresist pattern to form the fourth spaces; and forming the contact structures by depositing a conductive material in the fourth spaces and performing a chemical mechanical polishing process.

14. The method of claim 1, wherein the isolation pattern is surrounded by the second insulating layer in plan view.

\* \* \* \* \*